(12) United States Patent
Kojima et al.

(10) Patent No.: US 11,018,291 B2
(45) Date of Patent: May 25, 2021

(54) ULTRASONIC DEVICE AND ULTRASONIC APPARATUS

(71) Applicant: Seiko Epson Corporation, Tokyo (JP)

(72) Inventors: Chikara Kojima, Matsumoto (JP); Koji Ohashi, Matsumoto (JP); Hikaru Iwai, Matsukawa (JP); Kanechika Kiyose, Matsumoto (JP)

(73) Assignee: Seiko Epson Corporation

( * ) Notice: Subject to any disclaimer, the term of this patent is extended or adjusted under 35 U.S.C. 154(b) by 733 days.

(21) Appl. No.: 15/846,965

(22) Filed: Dec. 19, 2017

(65) Prior Publication Data

US 2018/0182949 A1    Jun. 28, 2018

(30) Foreign Application Priority Data

Dec. 26, 2016    (JP) .............................. JP2016-250712

(51) Int. Cl.

| | |
|---|---|
| *H01L 41/047* | (2006.01) |
| *H01L 41/113* | (2006.01) |
| *H01L 41/08* | (2006.01) |
| *B06B 1/06* | (2006.01) |
| *B06B 1/02* | (2006.01) |
| *H01L 41/09* | (2006.01) |

(52) U.S. Cl.
CPC ........ *H01L 41/0471* (2013.01); *B06B 1/0622* (2013.01); *H01L 41/0475* (2013.01); *H01L 41/081* (2013.01); *H01L 41/1132* (2013.01); *B06B 1/0207* (2013.01); *B06B 1/0644* (2013.01); *H01L 41/0973* (2013.01)

(58) Field of Classification Search
CPC ............. H01L 41/0471; H01L 41/0475; H01L 41/047; B06B 1/06; B06B 1/0603; B06B 1/0622
USPC .................................. 310/322, 334, 365, 366
See application file for complete search history.

(56) References Cited

U.S. PATENT DOCUMENTS

| | | | |
|---|---|---|---|
| 8,562,113 | B2 | 10/2013 | Harigai et al. |
| 2012/0038714 | A1 | 2/2012 | Harigai et al. |
| 2013/0063530 | A1 | 3/2013 | Higashino et al. |

(Continued)

FOREIGN PATENT DOCUMENTS

| | | |
|---|---|---|
| JP | 2011-182298 A | 9/2011 |
| JP | 2014-195494 A | 10/2014 |

(Continued)

*Primary Examiner* — Derek J Rosenau
(74) *Attorney, Agent, or Firm* — Harness, Dickey & Pierce, P.L.C.

(57) ABSTRACT

An ultrasonic device includes a vibration portion, a first electrode, a piezoelectric body, and a second electrode which are laminated in this order in a laminate direction, in which an outer circumferential edge of the first electrode is larger than an outer circumferential edge of the piezoelectric body in a plan view across the laminate direction, in which the piezoelectric body includes an active portion that is provided in the vibration portion, and an extraction portion that is connected to the active portion and is provided over the inside and the outside of the vibration portion, in which a width dimension of the extraction portion is smaller than a width dimension of the active portion, and in which the second electrode is provided on the active portion and the extraction portion.

14 Claims, 18 Drawing Sheets

(56) References Cited

U.S. PATENT DOCUMENTS

| | | | |
|---|---|---|---|
| 2013/0084199 A1* | 4/2013 | Tanaka | H01L 41/0973 417/413.2 |
| 2013/0201258 A1* | 8/2013 | Hirai | H01L 41/047 347/70 |
| 2014/0296716 A1 | 10/2014 | Kiyose et al. | |
| 2015/0187347 A1 | 7/2015 | Kojima et al. | |

FOREIGN PATENT DOCUMENTS

| | | |
|---|---|---|
| JP | 2015-126449 A | 7/2015 |
| JP | 2016-013146 A | 1/2016 |
| WO | WO-2011-129072 A1 | 10/2011 |
| WO | 2011-142256 A1 | 11/2011 |

* cited by examiner

ULTRASONIC DEVICE AND ULTRASONIC APPARATUS

BACKGROUND

1. Technical Field

The present invention relates to an ultrasonic device and an ultrasonic apparatus.

2. Related Art

In the related art, there is an ultrasonic sensor (ultrasonic device) including a substrate provided with a plurality of openings, vibration plates provided to close the respective openings on the substrate, and piezoelectric elements provided in respective regions (vibration portions) overlapping the openings on the vibration plates (refer to JP-A-2015-126449).

Each of the piezoelectric elements is formed by sequentially laminating a first electrode, a piezoelectric body, and a second electrode in this order from the vibration portion side. The ultrasonic device is driven when a voltage is applied between the first electrode and the second electrode, and transmits an ultrasonic wave. The ultrasonic device outputs a change in a potential difference between the first electrode and the second electrode as a received signal of the ultrasonic wave when the ultrasonic wave is received.

Here, in the piezoelectric element disclosed in JP-A-2015-126449, the first electrode is provided on the substantially entire surface of the vibration plate, the piezoelectric body is provided in the opening, and the second electrode is provided on the piezoelectric body, in a plan view which is viewed from the laminate direction. An insulating film is provided which covers the first electrode, the piezoelectric body, and the second electrode, and exposes a part of the second electrode. A conduction wire which connects the second electrodes to each other between a plurality of piezoelectric elements is provided on the insulating film. Consequently, since insulation between the first electrode and the second electrode can be ensured, and a plurality of second electrodes can be connected to each other, a plurality of piezoelectric elements connected to the second electrodes can be simultaneously driven.

However, in the ultrasonic device disclosed in JP-A-2015-126449, there is concern that deformation of the piezoelectric body or the vibration portion may be hindered by the insulating film or the conduction wire, and thus transmission/reception sensitivity of ultrasonic waves may deteriorate.

In other words, the insulating film is formed to cover the substantially entire surface of the piezoelectric element, and the conduction wire is formed on the insulating film over the inside and the outside of the vibration portion in a plan view. There is concern that the deformation of the piezoelectric body or the vibration portion may be hindered due to the rigidity of the insulating film or the conduction wire, and thus the transmission sensitivity and the reception sensitivity of ultrasonic waves may deteriorate, that is, the transmission/reception sensitivity may deteriorate.

SUMMARY

An advantage of some aspects of the invention is to provide an ultrasonic device and an ultrasonic apparatus capable of improving transmission/reception sensitivity.

An ultrasonic device according to an application example of the invention includes a vibration portion, a first electrode, a piezoelectric body, and a second electrode laminated in this order in a laminate direction, in which an outer circumferential edge of the first electrode is larger than an outer circumferential edge of the piezoelectric body in a plan view from the laminate direction, in which the piezoelectric body includes an active portion that is provided in the vibration portion, and an extraction portion that is connected to the active portion and is provided over the inside and the outside of the vibration portion, in which a width dimension of the extraction portion is smaller than a width dimension of the active portion, and in which the second electrode is provided on the active portion and the extraction portion.

Here, in a plan view, a region in which the first electrode, the piezoelectric body, and the second electrode overlap each other is a drive region in which a piezoelectric element is driven when a voltage is applied between the electrodes.

In this application example, an outer circumferential edge of the first electrode is larger than an outer circumferential edge of the piezoelectric body in a plan view from a laminate direction (hereinafter, simply referred to as a plan view). In other words, since the outer circumferential edge of the first electrode is located outside the outer circumferential edge of the piezoelectric body, compared with a case where the outer circumferential edge of the first electrode is located inside the outer circumferential edge of the piezoelectric body, an area of the drive region can be increased, and thus it is possible to improve transmission/reception sensitivity of the ultrasonic device.

In this application example, the piezoelectric body includes the extraction portion that is connected to the active portion provided in the vibration portion, and is provided over the inside and the outside of the vibration portion. The second electrode is provided on the active portion and the extraction portion, and is extracted from the inside of the vibration portion to the outside of the vibration portion while being insulated from the first electrode. In this configuration, an insulating film is not required to be separately provided between the first electrode and the second electrode, and vibration of the vibration portion is not hindered due to the insulating film, and thus it is possible to prevent deterioration in the transmission/reception sensitivity.

Since a width dimension of the extraction portion is smaller than a width dimension of the active portion, it is possible to prevent a hindrance to vibration of the vibration portion due to the extraction portion compared with a case where a width dimension of the extraction portion is the same as that of the active portion, and thus to suppress deterioration in the transmission/reception sensitivity.

As mentioned above, in the application example, it is possible to improve the transmission/reception sensitivity of the ultrasonic device.

In the ultrasonic device according to the application example, it is preferable that the extraction portion includes a connection part connected to the active portion, and the connection part has an increasing width dimension toward the active portion in the plan view.

In the application example with this configuration, since a width dimension of the connection part increases toward the active portion, it is possible to suppress both of deterioration in the rigidity of the extraction portion and deterioration in the transmission/reception sensitivity. It is possible to prevent the stress from concentrating on the connection part, and thus to prevent the occurrence of a crack in the connection part due to the stress.

In the ultrasonic device according to the application example, it is preferable that the first electrode is provided to cover the vibration portion in the plan view.

In the application example with this configuration, since the vibration portion is covered with the first electrode, the stress applied to the vibration portion can be alleviated by the first electrode, and thus it is possible to suppress the occurrence of a crack in the vibration portion or deterioration in vibration characteristics due to the stress.

In the ultrasonic device according to the application example, it is preferable that surfaces of the active portion and the extraction portion of the piezoelectric body on an opposite side to the first electrode are coplanar with each other.

In the application example with this configuration, the second electrode is formed over one surface of the active portion and the extraction portion which are coplanar with each other. In this configuration, compared with a case where a step difference is formed on the formation surface of the second electrode, there is no concern about the occurrence of defects such as an increase in wire resistance or disconnection due to thinning of the second electrode at the step difference, and it is possible to improve connection reliability of the second electrode.

It is preferable that the ultrasonic device according to the application example further includes a substrate having a plurality of openings and a support film closing the openings, the support film is formed of the vibration portion including the support film at positions overlapping the plurality of openings in the plan view, and a support portion other than the vibration portion, the piezoelectric body having the active portion and the extraction portion, and the second electrode are provided in each of a plurality of the vibration portions, and the extraction portions are respectively connected to each other in the support portion, and thus the second electrodes provided on the extraction portions are electrically connected to each other.

In the application example with this configuration, a plurality of extraction portions are connected to each other, and thus a plurality of second electrodes are electrically connected to each other, in the support portion provided in the region other than the openings of the substrate. In this configuration, since a connection position is located outside the vibration portion, vibration of the vibration portion is not hindered, and it is possible to suppress deterioration in the transmission/reception sensitivity.

In the ultrasonic device according to the application example, it is preferable that the first electrode is provided in a region other than a first region in which the extraction portion and the second electrode are provided to extend on the support portion in an array region in which the plurality of openings are provided, and the extraction portion and the second electrode are provided over the first region, and are connected to each other in the first region.

In the application example with this configuration, the first electrode is provided in a region which is different from the first region in which the extraction portion and the second electrode are provided to extend on the support portion. Here, if the first electrode is formed at a position (that is, the first region) overlapping the second electrode, there is concern that the second electrode may be disconnected due to deformation of the extraction portion when a voltage is applied between the electrodes. In contrast, in the application example, there is no occurrence of a defect such as disconnection of the second electrode due to deformation of the extraction portion, and the reliability of wiring connection can be improved.

It is preferable that the ultrasonic device according to the application example further includes a third electrode that is provided to be separated from the first electrode in the first region, and the extraction portion is formed on the third electrode.

In the application example with this configuration, the extraction portion is provided on the third electrode which is separated from the first electrode in the first region. In this configuration, it becomes easier to make the formation surface of the second electrode in the active portion provided on the first electrode coplanar with the formation surface of the second electrode in the extraction portion than in a case where the extraction portion is provided directly on the support portion, and it is possible to suppress disconnection of the second electrode.

An ultrasonic apparatus according to an application example of the invention includes the ultrasonic device according to the application example, and a controller that controls the ultrasonic device.

In this application example, in the same manner as in the above application example, since an outer circumferential edge of the first electrode is larger than an outer circumferential edge of the piezoelectric body in a plan view, an area of the drive region can be increased compared with a case where the outer circumferential edge of the first electrode is smaller than the outer circumferential edge of the piezoelectric body, and thus it is possible to improve transmission/reception sensitivity of the ultrasonic device.

In the application example, the piezoelectric body includes the extraction portion that is connected to the active portion provided in the vibration portion, and is provided over the inside and the outside of the vibration portion. The second electrode is provided on the active portion and the extraction portion, and is extracted from the inside of the vibration portion to the outside of the vibration portion while being insulated from the first electrode. In this configuration, an insulating film is not required to be separately provided between the first electrode and the second electrode, and vibration of the vibration portion is not hindered due to the insulating film, and thus it is possible to prevent deterioration in the transmission/reception sensitivity.

Since a width dimension of the extraction portion is smaller than a width dimension of the active portion, it is possible to prevent a hindrance to vibration of the vibration portion due to the extraction portion compared with a case where a width dimension of the extraction portion is the same as that of the active portion, and thus to suppress deterioration in the transmission/reception sensitivity.

As mentioned above, in the application example, it is possible to improve the transmission/reception sensitivity of the ultrasonic device and thus to perform highly accurate ultrasonic measurement.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Hereinafter, an ultrasonic measurement apparatus according to a first embodiment will be described with reference to the drawings.

Figure 1:
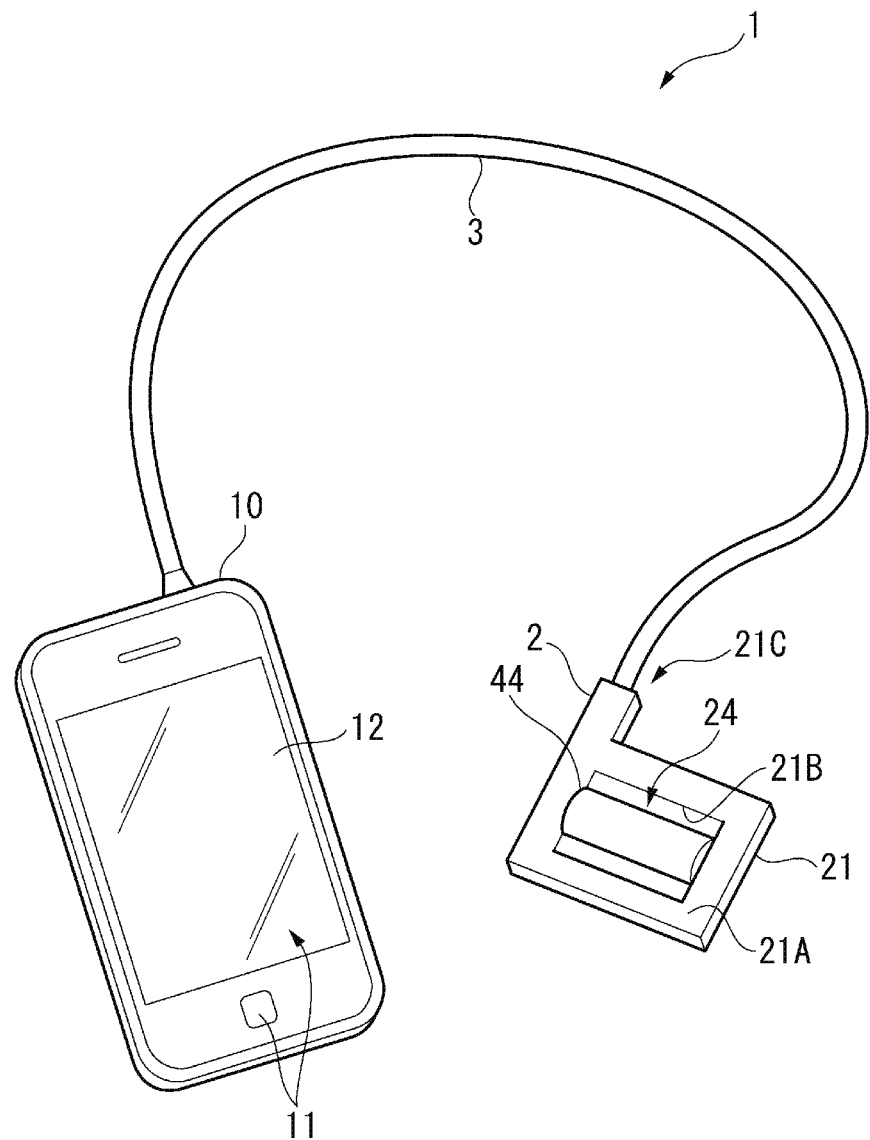
FIG. 1 is a perspective view illustrating a schematic configuration of an ultrasonic measurement apparatus according to a first embodiment.

FIG. 1 is a perspective view illustrating a schematic configuration of an ultrasonic measurement apparatus 1.

As illustrated in FIG. 1, the ultrasonic measurement apparatus 1 includes an ultrasonic probe 2 and a control device 10 electrically connected to the ultrasonic probe 2 via a cable 3.

The ultrasonic measurement apparatus 1 sends ultrasonic waves into a living body from the ultrasonic probe 2 in a state in which the ultrasonic probe 2 is brought into contact with a surface of the living body (human body). Ultrasonic waves reflected from an organ in the living body are received by the ultrasonic probe 2, and, for example, an internal tomographic image of the living body is obtained or a state (for example, a blood flow) of an organ in the living body is measured, on the basis of a received signal.

Configuration of Control Device

The control device 10 corresponds to a controller, and includes, as illustrated in FIG. 1, an operation unit 11 provided with a button or a touch panel, and a display unit 12. Although not illustrated, the control device 10 includes a storage unit formed of a memory or the like, and a calculation unit formed of a central processing unit (CPU) or the like. The control device 10 causes the calculation unit to execute various programs stored in the storage unit, and thus controls the ultrasonic measurement apparatus 1. For example, the control device 10 outputs a command for controlling driving of the ultrasonic probe 2, forms an image of an internal structure of a living body and displays the image on the display unit 12 on the basis of a received signal which is input from the ultrasonic probe 2, or measures biological information such as a blood flow and displays the biological information on the display unit 12. As the control device 10, for example, a terminal device such as a tablet terminal, a smart phone, or a personal computer may be used, and a dedicated terminal device for operating the ultrasonic probe 2 may be used.

Configuration of Ultrasonic Probe

Figure 2:
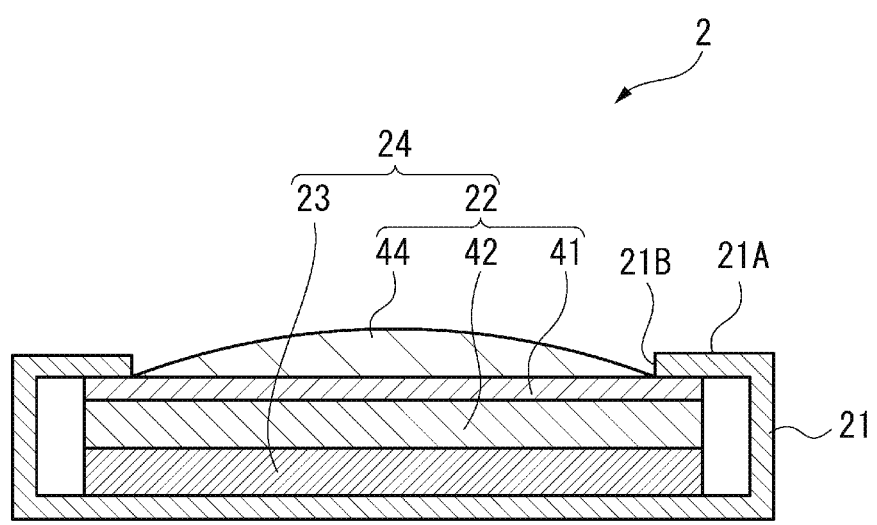
FIG. 2 is a sectional view illustrating a schematic configuration of an ultrasonic probe according to the first embodiment.

FIG. 2 is a sectional view illustrating a schematic configuration of the ultrasonic probe 2.

As illustrated in FIG. 2, the ultrasonic probe 2 includes a casing 21, an ultrasonic device 22 stored in the casing 21, and a circuit substrate 23 provided with a driver circuit and the like for controlling the ultrasonic device 22. An ultrasonic sensor 24 is formed of the ultrasonic device 22 and the circuit substrate 23.

Configuration of Casing

As illustrated in FIG. 1, the casing 21 is formed in a rectangular box shape in a plan view, and is provided with a sensor window 21B on one surface (sensor surface 21A) which is orthogonal to a thickness direction, and a part of the ultrasonic device 22 is exposed to one surface. A passing hole 21C of the cable 3 is provided at a part (a side surface in the example illustrated in FIG. 1) of the casing 21. The cable 3 is inserted into the casing 21 through the passing hole 21C so as to be connected to the circuit substrate 23. A gap between the cable 3 and the passing hole 21C is filled with, for example, a resin material, and thus water resistance is ensured.

In the present embodiment, a configuration example in which the ultrasonic probe 2 is connected to the control device 10 via the cable 3 is described, but this is only an example, and, for example, the ultrasonic probe 2 and the control device 10 may be connected to each other via wireless communication, and various constituent elements of the control device 10 may be provided in the ultrasonic probe 2.

Configuration of Circuit Substrate

The circuit substrate 23 is electrically connected to a common terminal 413 and a signal terminal 414 (refer to FIG. 3) of the ultrasonic device 22 which will be described later, and controls the ultrasonic device 22 under the control of the control device 10.

Specifically, the circuit substrate 23 is provided with a transmission circuit, a reception circuit, and the like. The transmission circuit outputs a drive signal for causing the ultrasonic device 22 to transmit an ultrasonic wave. The reception circuit acquires a received signal output from the ultrasonic device 22 having received an ultrasonic wave, performs an amplification process, an A/D conversion process, an phasing addition process, and the like on the received signal, and outputs the received signal having undergone the processes to the control device 10.

Configuration of Ultrasonic Device

Figure 3:
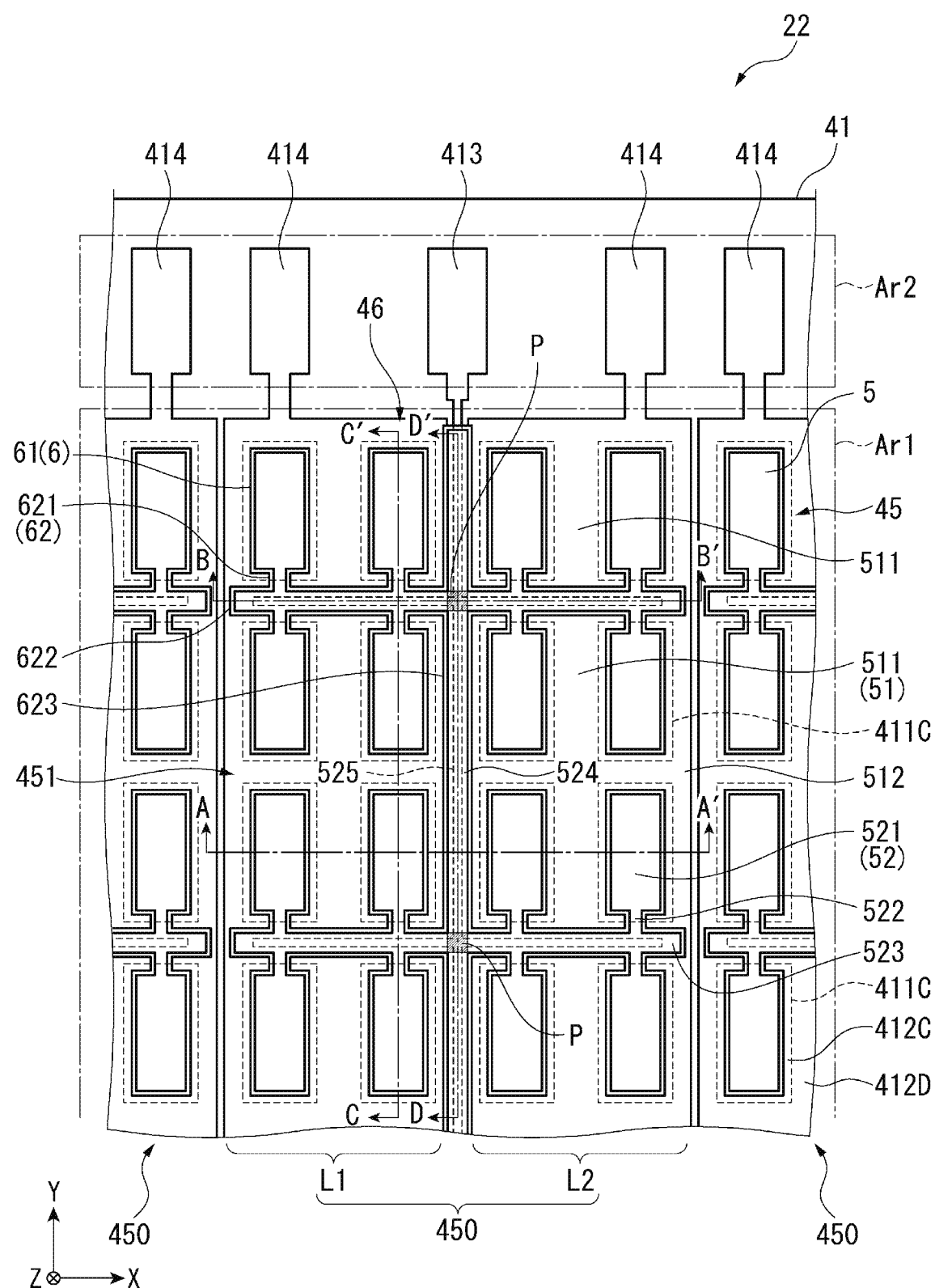
FIG. 3 is a plan view schematically illustrating an element substrate in the ultrasonic device of the first embodiment.
Figure 4:
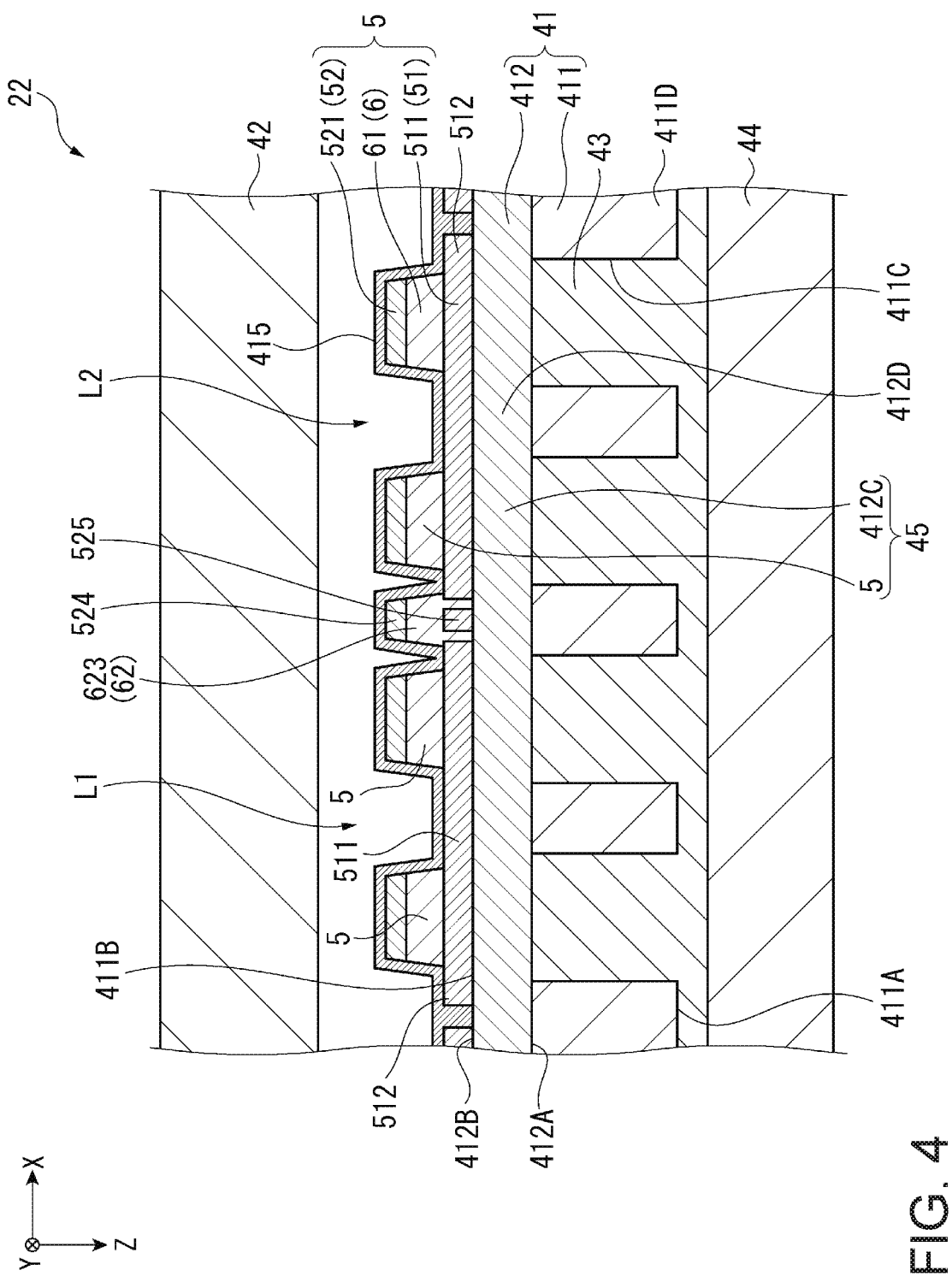
FIG. 4 is a sectional view schematically illustrating the ultrasonic device of the first embodiment.
Figure 5:
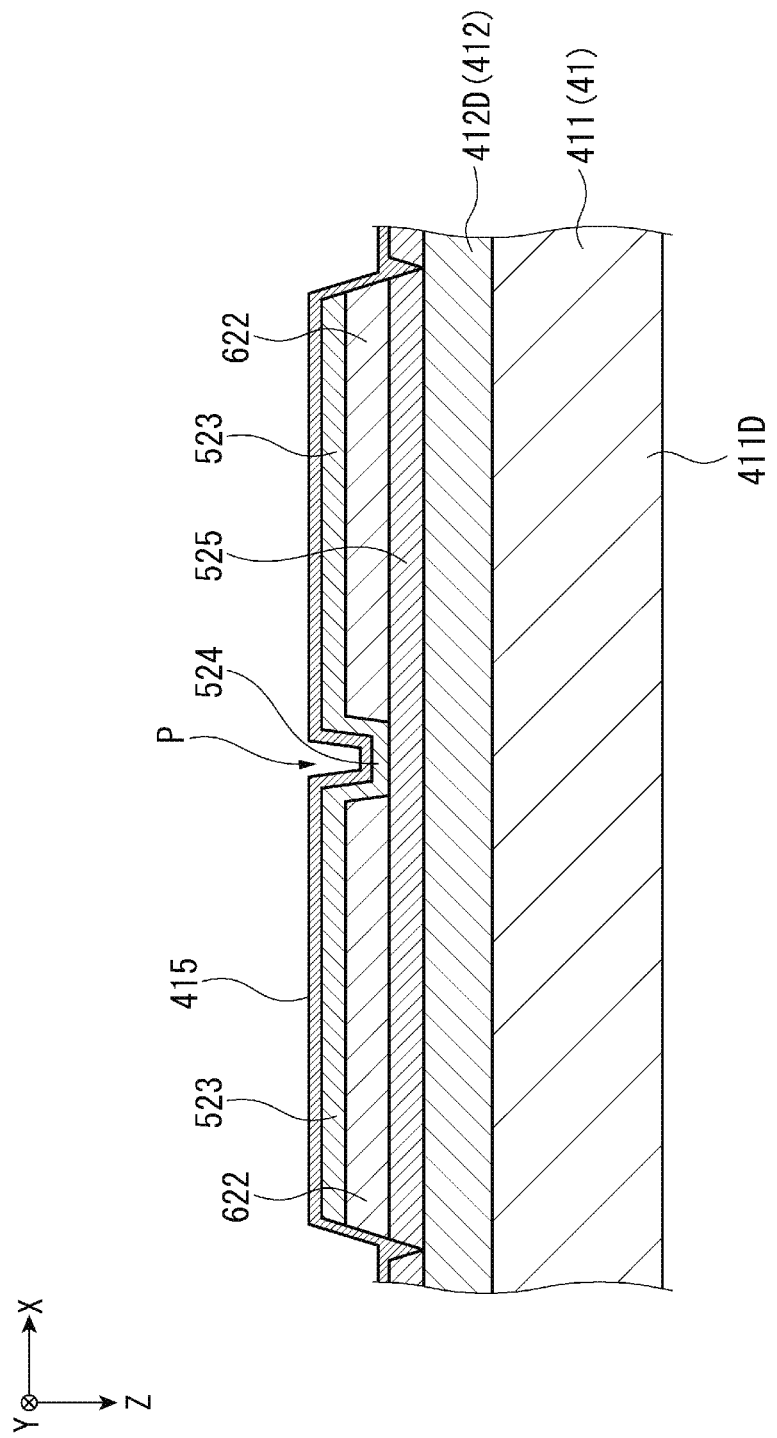
FIG. 5 is a sectional view schematically illustrating the ultrasonic device of the first embodiment.
Figure 6:
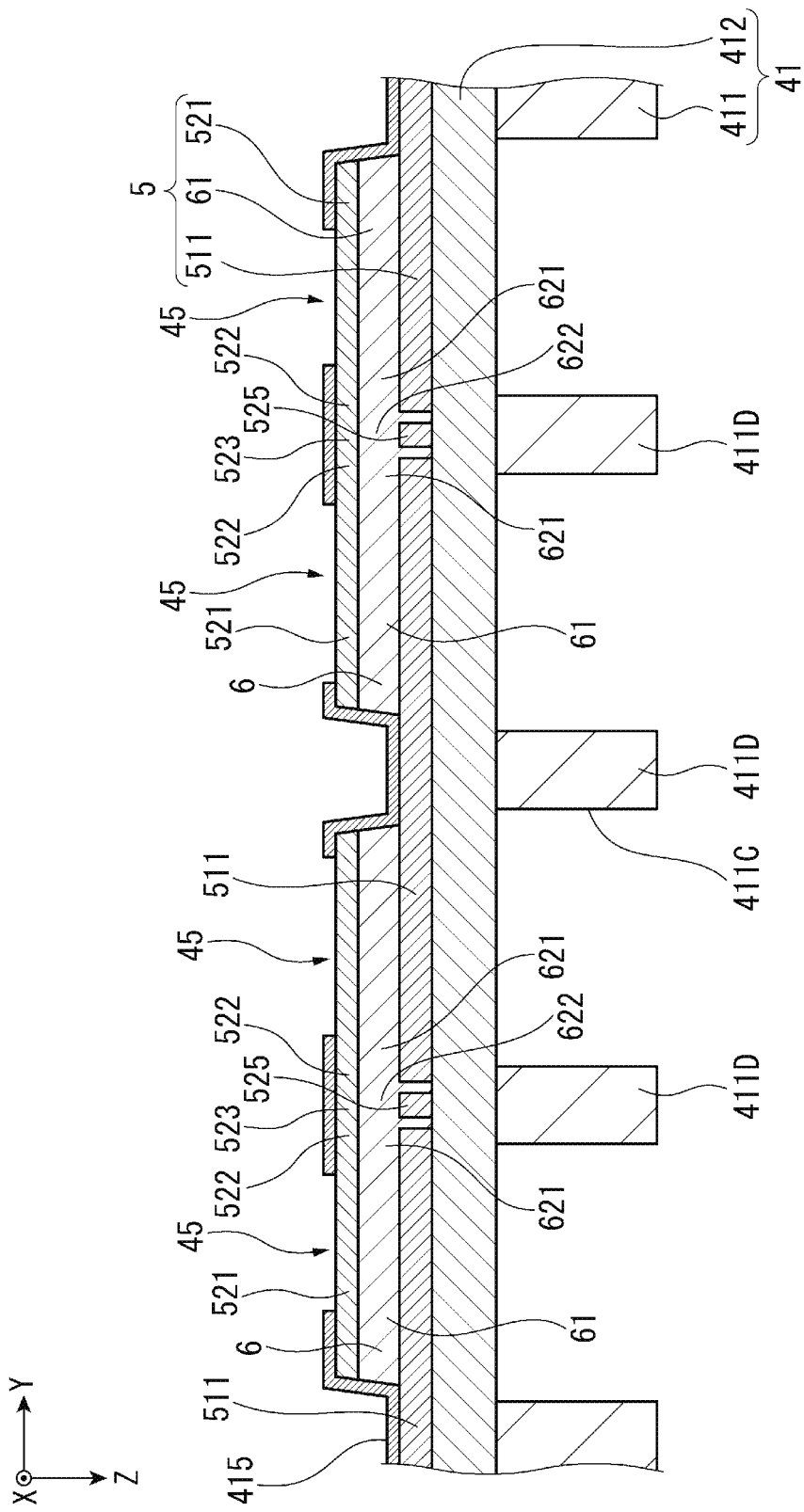
FIG. 6 is a sectional view schematically illustrating the ultrasonic device of the first embodiment.
Figure 7:
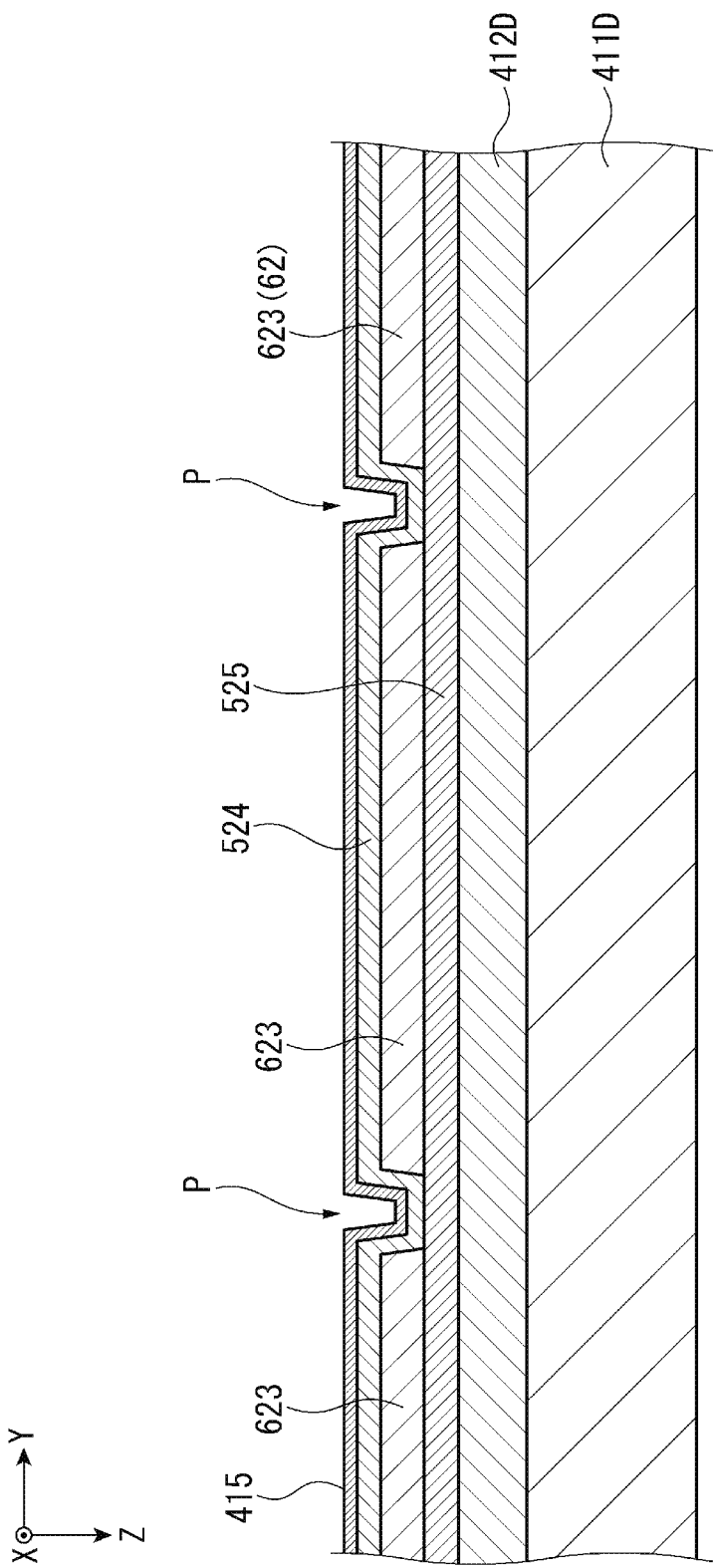
FIG. 7 is a sectional view schematically illustrating the ultrasonic device of the first embodiment.

FIG. 3 is a schematic diagram in which an element substrate 41 forming the ultrasonic device 22 is viewed from a sealing plate 42 side. FIG. 4 is a sectional view schematically illustrating a section of the ultrasonic device 22 taken along the line A-A' illustrated in FIG. 3. FIG. 5 is a sectional view schematically illustrating a section of the ultrasonic device 22 taken along the line B-B' illustrated in FIG. 3. FIG. 6 is a sectional view schematically illustrating a section of the ultrasonic device 22 taken along the line C-C' illustrated in FIG. 3. FIG. 7 is a sectional view schematically illustrating a section of the ultrasonic device 22 taken along the line D-D' illustrated in FIG. 3. FIG. 3 illustrates only a part including an end of the ultrasonic device 22 on a +Y side.

As illustrated in FIG. 4, the ultrasonic device 22 is configured to include the element substrate 41, the sealing plate 42, an acoustic layer 43, and an acoustic lens 44. In FIGS. 5 to 7, the sealing plate 42, the acoustic layer 43, and the acoustic lens 44 are not illustrated.

Configuration of Element Substrate

As illustrated in FIG. 3, in a plan view (hereinafter, simply referred to as a plan view) in which the element substrate 41 is viewed from a substrate thickness direction (a Z direction and corresponding to a laminate direction), a plurality of ultrasonic transducers 45 transmitting and receiving ultrasonic waves are disposed in a central region of the element substrate 41 in an array region Ar1. The plurality of ultrasonic transducers 45 are disposed in a matrix form along an X direction (scanning direction) and the Y direction, and form an ultrasonic transducer array 46. The ultrasonic transducer array 46 includes the plurality of ultrasonic transducers 45, and is formed as a one-dimensional ultrasonic array in which a plurality of ultrasonic transducer units 450 each functioning as a single transmission/reception channel are disposed along the X direction.

The ultrasonic transducer unit 450 will be described later.

The element substrate 41 corresponds to a substrate, and includes, as illustrated in FIG. 4, a substrate main body portion 411, and a support film 412 provided on the substrate main body portion 411 on the sealing plate 42 side (−Z side).

Here, in the following description, a surface of the substrate main body portion 411 on the acoustic lens 44 side will be referred to as a front surface 411A, and a surface on the sealing plate 42 side will be referred to as a rear surface 411B. A surface of the support film 412 opposite to the sealing plate 42 will be referred to as an ultrasonic wave transmission/reception surface 412A, and a surface thereof on the sealing plate 42 side will be referred to as an operation surface 412B.

The substrate main body portion 411 is a substrate supporting the support film 412, and is formed of, for example, a semiconductor substrate such as Si. An opening 411C corresponding to each of the ultrasonic transducers 45 is provided in the substrate main body portion 411.

The support film 412 is made of, for example, $SiO_2$ or a laminate of $SiO_2$ and $ZrO_2$, and is provided on the rear surface 411B of the substrate main body portion 411. A thickness dimension of the support film 412 is sufficiently smaller than that of the substrate main body portion 411. The support film 412 includes a vibration portion 412C closing the opening 411C on the rear surface 411B, and a support portion 412D located on a wall portion 411D forming the opening 411C. In other words, the opening 411C defines an outer edge of the vibration portion 412C which is a vibration region of the support film 412.

A piezoelectric element 5 is provided on the operation surface 412B of each of a plurality of vibration portions 412C. As will be described later in detail, the piezoelectric element 5 is formed as a laminate in which a lower electrode main body portion 511 of a lower electrode 51, an active portion 61 of a piezoelectric film 6, and an upper electrode main body portion 521 of an upper electrode 52 are laminated in this order. A single ultrasonic transducer 45 is formed of the vibration portion 412C of the support film 412 and the piezoelectric element 5.

In the ultrasonic transducer 45, a pulse wave voltage having a predetermined frequency is applied between the lower electrode main body portion 511 and the upper electrode main body portion 521 so that the vibration portion 412C vibrates, and thus an ultrasonic wave is transmitted from the ultrasonic wave transmission/reception surface 412A side. If the vibration portion 412C vibrates due to an ultrasonic wave which is reflected from a target object and is incident to the ultrasonic wave transmission/reception surface 412A, a potential difference is generated between upper and lower parts of the piezoelectric film 6, that is, between the lower electrode 51 and the upper electrode 52. The ultrasonic wave is detected, that is, the ultrasonic wave is received by detecting a potential difference generated between the lower electrode 51 and the upper electrode 52.

Configuration of Sealing Plate

A planar shape of the sealing plate 42 illustrated in FIGS. 2 and 4, viewed from the thickness direction, is formed to be the same as, for example, that of the element substrate 41, and is formed of a semiconductor substrate such as Si or an insulator substrate. A material or a thickness of the sealing plate 42 influences frequency characteristics of the ultrasonic transducer 45, and is thus preferably set on the basis of a center frequency of an ultrasonic wave which is transmitted and received in the ultrasonic transducer 45.

The sealing plate 42 is provided with openings (not illustrated) at positions facing the common terminal 413 and the signal terminal 414 of the element substrate 41, and the common terminal 413 and the signal terminal 414 are electrically connected to the circuit substrate 23 via the openings by using, for example, an FPC.

Configurations of Acoustic Layer and Acoustic Lens

As illustrated in FIG. 4, the acoustic layer 43 is provided on the element substrate 41 on the ultrasonic wave transmission/reception surface 412A side. In other words, the acoustic layer 43 fills the opening 411C.

The acoustic lens 44 is disposed on the front surface 411A side of the element substrate 41, that is, the +Z side of the element substrate 41 and the acoustic layer 43. The acoustic lens 44 is brought into close contact with a living body surface, and causes an ultrasonic wave transmitted from the ultrasonic transducer 45 to converge in the living body. The acoustic lens 44 causes an ultrasonic wave reflected inside the living body to propagate toward the ultrasonic transducer 45 via the acoustic layer 43.

Each the acoustic layer 43 and the acoustic lens 44 is set to acoustic impedance similar to acoustic impedance of the living body. Consequently, the acoustic layer 43 and the acoustic lens 44 cause an ultrasonic wave transmitted from the ultrasonic transducer 45 to propagate toward a living body with high efficiency, and cause an ultrasonic wave reflected inside the living body to propagate toward the ultrasonic transducer 45 with high efficiency.

Configuration of Ultrasonic Transducer Unit

As illustrated in FIG. 3, the ultrasonic transducer unit 450 is configured to include a plurality of transducer columns (four columns in FIG. 3) each including a plurality of ultrasonic transducers 45 which are arranged along the Y direction. Here, among the columns of the ultrasonic transducers 45 arranged in the Y direction, two columns on the −X side will be referred to as −X side columns L1, two columns on the +X side will be referred to as +X side columns L2. In the present embodiment, as will be described later, in the −X side columns L1 and the +X side columns L2, a plurality of ultrasonic transducers 45 are connected in parallel to each other.

In the ultrasonic transducer unit 450, the −X side columns L1 and the +X side columns L2 are linearly symmetric to each other with respect to a virtual line which passes through an intermediate position therebetween and is parallel to the Y direction, and, thus, the −X side columns L1 will be hereinafter focused.

The piezoelectric element 5 of the ultrasonic transducer 45 is formed as a laminate of the lower electrode 51, the piezoelectric film 6, and the upper electrode 52.

The lower electrode 51 includes the lower electrode main body portion 511 and a lower electrode connection portion 512 connecting a plurality of lower electrode main body portions 511 to each other. As a material of the lower electrode 51, for example, metal materials such as Pt, Ir, Ti, Zr, Au, Ni, NiCr, TiW, Al, and Cu may be used.

The lower electrode main body portion 511 corresponds to a first electrode, and is formed at a position overlapping the opening 411C in a plan view. In the present embodiment, the lower electrode main body portion 511 is provided to cover the opening 411C, and an outer edge of the lower electrode main body portion 511 is located outside the outer edge of the opening 411C.

The lower electrode main body portion 511 is provided over four ultrasonic transducers 45 (hereinafter, referred to as an ultrasonic transducer group 451 in some cases) adjacent to each other in the X direction and the Y direction among the plurality of ultrasonic transducers 45 forming the −X side columns L1. The lower electrode main body portion 511 is provided over two ultrasonic transducers 45 with respect to the ultrasonic transducers 45 located at end parts on the ±Y sides. This is also the same for the +X side columns L2.

The lower electrode connection portion 512 is provided along the Y direction on the −X side of a plurality of lower electrode main body portions 511, and connects the plurality of lower electrode main body portions 511 to each other, in the −X side columns L1. The lower electrode connection portion 512 is provided along the Y direction on the +X side of a plurality of lower electrode main body portions 511, and connects the plurality of lower electrode main body portions 511 to each other, in the +X side columns L2.

As illustrated in FIG. 3, the lower electrode 51 is connected to the common terminal 413 in a terminal region Ar2 located on the ±Y side of the array region Ar1. The common terminal 413 is connected to, for example, a reference potential circuit (not illustrated) of the circuit substrate 23, and is set to a reference potential. FIG. 3 illustrates only the terminal region Ar2 on the +Y side of the array region Ar1, but the terminal region Ar2 is also provided on the −Y side of the array region Ar1, and the lower electrode 51 is connected to the common terminal 413.

The piezoelectric film 6 corresponds to a piezoelectric body, and includes the active portion 61 and an extraction portion 62. The piezoelectric film 6 is formed by using, for example, a transition metal oxide having a perovskite structure, specifically, lead zirconate titanate containing Pb, Ti, and Zr.

The active portion 61 is provided at each of a plurality of vibration portions 412C, and an outer dimension of the active portion 61 is smaller than a dimension of the vibration portion 412C (opening 411C) in a plan view. The active portion 61 is deformed due to a voltage applied between the lower electrode 51 and the upper electrode 52.

The extraction portion 62 includes an extraction main part 621, a first extension part 622, and a second extension part 623.

The extraction main part 621 extends from each active portion 61, and is provided over the inside and the outside of the vibration portion 412C along the Y direction in a plan view. As illustrated in FIG. 3, the extraction main part 621 is provided on the +Y side of the active portion 61 in two ultrasonic transducers 45 located on the +Y side among the four ultrasonic transducers 45 forming the ultrasonic transducer group 451. The extraction main part 621 is provided on the −Y side of the active portion 61 in two ultrasonic transducers 45 located on the −Y side among the four ultrasonic transducers 45 forming the ultrasonic transducer group 451.

As illustrated in FIG. 3, a dimension of the extraction main part 621 in a width direction (X direction) orthogonal to an extension direction (Y direction) thereof is smaller than that of the active portion 61.

As illustrated in FIG. 6, an upper surface (a surface on the −Z side) of the extraction main part 621 is coplanar with an upper surface of the active portion 61.

As illustrated in FIG. 3, the first extension part 622 and the second extension part 623 are provided to extend on the support portion 412D overlapping the wall portion 411D in a plan view.

As illustrated in FIG. 3, the first extension part 622 is provided along the X direction on each of the ±Y sides of the ultrasonic transducer group 451. The extraction main part 621 extracted from the ultrasonic transducer 45 adjacent to the first extension part 622 is connected to the first extension part 622 in the Y direction. In other words, the first extension part 622 is connected to the extraction main part 621 on the support portion 412D.

As illustrated in FIG. 3, the second extension part 623 is provided along the Y direction at the center of the ultrasonic transducer unit 450 in the X direction, that is, between the −X side columns L1 and the +X side columns L2.

The upper electrode 52 corresponds to a second electrode, and is provided on the piezoelectric film 6 by using the same metal material as that of the lower electrode 51 as illustrated in FIG. 3. The upper electrode 52 includes the upper electrode main body portion 521, an upper electrode extraction portion 522 extracted from the upper electrode main body portion 521, an upper electrode connection portion 523 connecting a plurality of upper electrode extraction portions 522 to each other, and an upper electrode extension portion 524 extending from the upper electrode connection portion 523.

The upper electrode main body portion 521 is provided on the substantially entire surface of the active portion 61. In a plan view, a region in which the lower electrode main body portion 511, the active portion 61, and the upper electrode main body portion 521 overlap each other is a drive region in which the piezoelectric element 5 is driven when a voltage is applied. Dimensions of the drive region in the X direction and the Y direction in a plan view are 0.7 times the dimensions of the opening 411C, and thus transmission/reception sensitivity of the ultrasonic transducer 45 can be improved.

The upper electrode extraction portion 522 is provided on the extraction main part 621, and is extracted from the active portion 61 in the Y direction. In other words, the upper electrode extraction portion 522 is provided to the upper surface of the extraction main part 621 from the upper surface of the coplanar active portion 61.

The upper electrode connection portion 523 is provided on the first extension part 622 along the X direction in a plan view. The upper electrode connection portion 523 connects a plurality of upper electrode extraction portions 522 to each other on the first extension part 622.

The upper electrode extension portion 524 is provided on the second extension part 623 along the Y direction in a plan view. The upper electrode extension portion 524 connects a plurality of upper electrode connection portions 523 to each other although not illustrated.

In a plan view, a region in which the upper electrode connection portion 523 and the first extension part 622 are provided and a region in which the upper electrode extension portion 524 and the second extension part 623 are provided correspond to a first region.

Here, as illustrated in FIG. 3, in a plan view, an upper electrode wiring portion 525 corresponding to a third electrode is provided at a position overlapping the first extension part 622 and the second extension part 623 on the element substrate 41. The upper electrode wiring portion 525 is simultaneously formed with, for example, the lower electrode 51, and is separated from the lower electrode 51 so as to be isolated.

As illustrated in FIG. 3, the upper electrode wiring portion 525 is connected to the upper electrode extension portion 524 at a connection position P at which the first extension part 622 intersects the second extension part 623. In other words, as illustrated in FIGS. 5 and 7, a part of the extraction portion 62 is removed at the connection position P, and the upper electrode extension portion 524 is provided on the upper electrode wiring portion 525.

As illustrated in FIG. 3, the upper electrode wiring portion 525 is connected to the signal terminal 414 in the terminal region Ar2. The signal terminal 414 is connected to, for example, the transmission circuit or the reception circuit of the circuit substrate 23. Although not illustrated in FIG. 3, the upper electrode wiring portion 525 is also connected to the signal terminal 414 in the terminal region Ar2 provided on the −Y side of the array region Ar1.

As described above, the upper electrode main body portions 521 of the respective ultrasonic transducers 45 are connected to each other. The lower electrode main body portions 511 of the respective ultrasonic transducers 45 are connected to each other in each of the −X side columns L1 and the +X side columns L2. In other words, the respective ultrasonic transducers 45 forming the −X side columns L1 are connected in parallel to each other on the element substrate 41. Similarly, the respective ultrasonic transducers 45 forming the +X side columns L2 are connected in parallel to each other on the element substrate 41.

In the present embodiment, the −X side columns L1 and the +X side columns L2 are connected in parallel to each other in the circuit substrate 23, and thus the ultrasonic transducer unit 450 is driven as a single transmission/reception channel. In other words, the respective ultrasonic transducers 45 forming the ultrasonic transducer unit 450 are connected in parallel to each other in the circuit substrate 23. In this configuration, when an ultrasonic wave is transmitted, the respective ultrasonic transducers 45 can be simultaneously driven, and thus an output level of an ultrasonic wave in the ultrasonic transducer unit 450 can be increased.

Here, in the present embodiment, a protection film 415 is provided on the substantially entire surface excluding a part of the array region Ar1 of the element substrate 41. Specifically, the protection film 415 has an opening which exposes at least a part of the drive region of each ultrasonic transducer 45. As a material forming the protection film 415, for example, an insulating metal oxide such as AlOx, TaOx, and BaOx may be used.

Transmission/Reception Sensitivity of Ultrasonic Transducer

Figure 8:
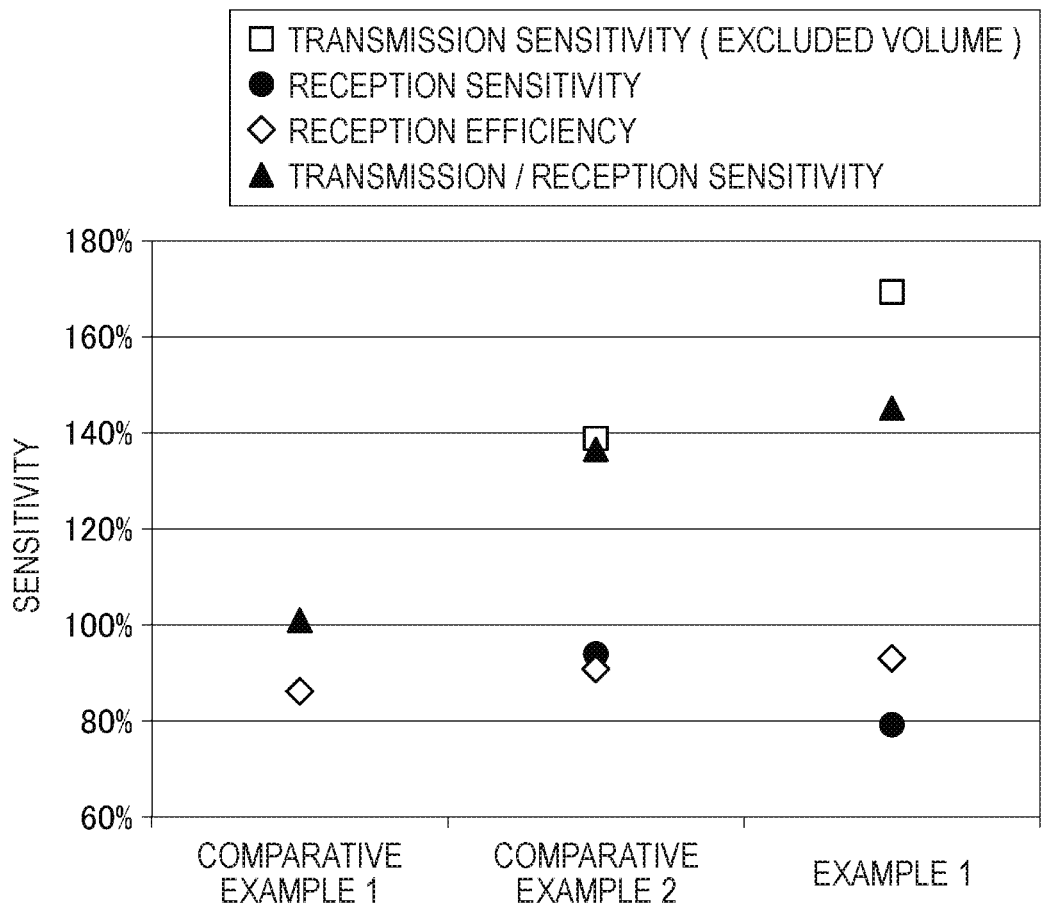
FIG. 8 is a diagram illustrating characteristics of an ultrasonic transducer of the first embodiment and a comparative example.

FIG. 8 is a diagram illustrating examples of transmission/reception sensitivities of the ultrasonic transducer 45 and an ultrasonic transducer of the related art.

As Comparative Example 1, FIG. 8 illustrates characteristics of an ultrasonic transducer in a case where width dimensions of a lower electrode and an upper electrode are smaller than that of a piezoelectric film, and are constant. As Comparative Example 2, FIG. 8 illustrates characteristics of an ultrasonic transducer in a case where a width dimension of an upper electrode is larger than in Comparative Example 1, and a width dimension of a piezoelectric film is substantially the same as that therein. In other words, a drive region of a piezoelectric element is larger in Comparative Example 2 than in Comparative Example 1.

The reception efficiency is expressed by a ratio (C1/(C1+C2)) when electrostatic capacitance of the ultrasonic probe is indicated by C1, and electrostatic capacitance of the cable 3 is indicated by C2. As illustrated in FIG. 8, in Example 1, the drive region is large, and thus the reception efficiency increases compared with Comparative Example 1 and Comparative Example 2.

The reception sensitivity is indicated by the magnitude of an output value (voltage value) of the ultrasonic transducer when an ultrasonic wave with predetermined intensity is received, and is expressed with reference to Comparative Example 1. As illustrated in FIG. 8, the reception sensitivity is slightly reduced in Comparative Example 2 compared with Comparative Example 1. The reception sensitivity is more reduced in Example 1 than in Comparative Example 2. Here, an output value of the ultrasonic transducer is proportional to a product between a piezoelectric constant of the piezoelectric film and a distortion of the piezoelectric film. A distortion of the piezoelectric film increases as a distance thereof to the center of the vibration portion 412C becomes shorter, and decreases as a distance thereof to the outer circumferential part becomes shorter. Therefore, as an area of the drive region relative to the vibration portion 412C becomes larger, a region in which a distortion of the piezoelectric film is small is included, and thus the reception sensitivity is reduced. For the above-described reason, the reception sensitivity is more reduced in Example 1 than in Comparative Example 1 and Comparative Example 2.

On the other hand, the transmission sensitivity is indicated by a volume (excluded volume) of a medium excluded by the vibration portion when the ultrasonic transducer is driven in a predetermined output level, and is expressed with reference to Comparative Example 1. As illustrated in FIG. 8, since the drive region of the piezoelectric element is larger in Comparative Example 2 than in Comparative Example 1, the transmission sensitivity is about 40% larger than in Comparative Example 1. In Example 1, the transmission sensitivity is 70% larger than in Comparative Example 1. This is because the lower electrode is provided to cover the vibration portion, and thus the drive region of the piezoelectric element is increased.

Since the transmission sensitivity is considerably increased, the transmission/reception sensitivity obtained as a product between the transmission sensitivity and the reception sensitivity is also increased. As illustrated in FIG. 8, in Example 1, the transmission/reception sensitivity is 40% or more larger than in Comparative Example 1, and is larger than in Comparative Example 2.

As mentioned above, in the ultrasonic transducer 45 of the present embodiment, the drive region of the piezoelectric element 5 is larger than in Comparative Examples 1 and 2, and thus the transmission/reception sensitivity is also large. In other words, the lower electrode main body portion 511 is formed to cover the vibration portion 412C, a width dimension of the upper electrode main body portion 521 is made larger, and thus the reception sensitivity is slightly reduced, but the drive region is increased, thus the transmission sensitivity is considerably increased, and, as a result, the transmission/reception sensitivity is increased.

In the present embodiment, a width dimension of the extraction main part 621 is smaller than a width dimension of the active portion 61 relative to Comparative Example 2, and thus deterioration in the reception sensitivity can be prevented.

Advantageous Effects of First Embodiment

In the ultrasonic transducer 45, an outer circumferential edge of the lower electrode main body portion 511 is larger than an outer circumferential edge of the active portion 61 in a plan view. Thus, an area of the drive region can be made larger than in a case where the outer circumferential edge of the lower electrode main body portion 511 is smaller than the outer circumferential edge of the active portion 61, and thus it is possible to improve the transmission/reception sensitivity of the ultrasonic device 22.

The extraction main part 621 is provided over the inside and the outside of the vibration portion 412C, and is connected to the active portion 61. The upper electrode 52 is provided on the active portion 61 and the extraction main part 621, and is extracted from the vibration portion 412C to the support portion 412D while being insulated from the lower electrode 51. In this configuration, an insulating film covering the lower electrode main body portion 511 is not required to be separately provided when the upper electrode extraction portion 522 is provided, and vibration of the vibration portion 412C is not hindered due to the insulating film, and thus it is possible to prevent deterioration in the transmission/reception sensitivity of the ultrasonic device 22.

Since a width dimension of the extraction main part 621 is smaller than a width dimension of the active portion 61, it is possible to prevent a hindrance to vibration of the vibration portion 412C due to the extraction main part 621 compared with a case where a width dimension of the extraction main part 621 is the same as that of the active portion 61, and thus to suppress deterioration in the transmission/reception sensitivity.

Since the lower electrode main body portion 511 is provided to cover the vibration portion 412C, the stress of the vibration portion 412C during deformation can be alleviated by elasticity of the lower electrode main body portion 511, and thus it is possible to prevent the occurrence of a crack in the vibration portion 412C or changes in characteristics of the vibration portion 412C.

Since the active portion 61 is provided on the lower electrode main body portion 511, similarly, the stress of the active portion 61 can be alleviated by elasticity of the lower electrode main body portion 511, and thus it is possible to prevent the occurrence of a crack in the active portion 61 or changes in piezoelectric characteristics.

Since the active portion 61 is provided on the lower electrode main body portion 511, the active portion 61 having a desired crystal orientation corresponding to the lower electrode main body portion 511 can be formed, and thus to improve the uniformity of a piezoelectric crystal in the active portion 61.

The upper electrode 52 is provided on the upper surfaces of the active portion 61 and the extraction portion 62 which are coplanar with each other. In this configuration, compared with a case where a step difference is formed on the formation surface of the upper electrode 52, there is no concern about the occurrence of defects such as an increase in wire resistance or disconnection due to thinning of the upper electrode 52 at the step difference, and it is possible to improve connection reliability of the upper electrode 52. For example, the upper electrode extraction portion 522 is formed on the upper surface of the extraction portion 62 which is coplanar with the upper surface of the active portion 61. Therefore, there is no occurrence of the defects at a boundary position between the active portion 61 and the extraction portion 62.

The extraction main parts 621 are connected to each other via the first extension part 622 and the second extension part 623 on the support portion 412D. The upper electrode extraction portions 522 are connected to each other via the upper electrode connection portion 523 and the upper electrode extension portion 524 on the first extension part 622 and the second extension part 623. In this configuration, since a connection position is not present on the vibration portion 412C in a plan view, and thus vibration of the vibration portion 412C is not hindered, it is possible to suppress deterioration in the transmission/reception sensitivity.

The lower electrode 51 is formed on the support portion 412D in regions other than the region in which the upper electrode connection portion 523 and the first extension part 622 are provided and in the region (first region) in which the upper electrode extension portion 524 and the second extension part 623 are provided. The extraction portion 62 and the upper electrode 52 are provided over the first region. In the first region in which the lower electrode 51 is not provided, the upper electrode extraction portions 522 are connected to each other via the upper electrode connection portion 523 and the upper electrode extension portion 524.

Here, if the lower electrode 51 is formed in the first region, there is concern that the upper electrode connection portion 523 or the upper electrode extension portion 524 may be disconnected due to deformation of the first extension part 622 and the second extension part 623 when a voltage is applied between the lower electrode 51 and the upper electrode 52. In contrast, in the present embodiment, the defects do not occur, and it is possible to improve the reliability of wire connection. In the first region, it is possible to prevent the upper electrode 52 from being electrically connected to the lower electrode 51, and thus to improve the reliability of wire connection. The substantially entire region of the support film 412 can be covered with the lower electrode 51 or the piezoelectric film 6, and thus it is possible to suppress deterioration in the support film 412.

In the first region, the upper electrode wiring portion 525 is provided on the support film 412. The first extension part 622 and the second extension part 623 are provided on the upper electrode wiring portion 525. Consequently, it becomes easier to make the upper surface of the active portion 61 and the upper surface of the extraction portion 62 provided on the lower electrode main body portion 511 coplanar than in a case where the first extension part 622 and the second extension part 623 are provided directly on the support portion 412D. Therefore, it is easy to make the upper surface of the piezoelectric film 6 flat and to improve the reliability of the upper electrode 52.

Second Embodiment

Hereinafter, a second embodiment will be described.

In the ultrasonic device of the first embodiment, a plurality of ultrasonic transducers 45 forming the ultrasonic transducer unit 450 are connected in parallel to each other. In contrast, the second embodiment is different from the first embodiment in that some of the plurality of ultrasonic transducers are connected in series to each other.

In the following description, the same constituent elements as those in the first embodiment are given the same reference numerals, and description thereof will be omitted or will be made briefly.

Configuration of Ultrasonic Device

Figure 9:
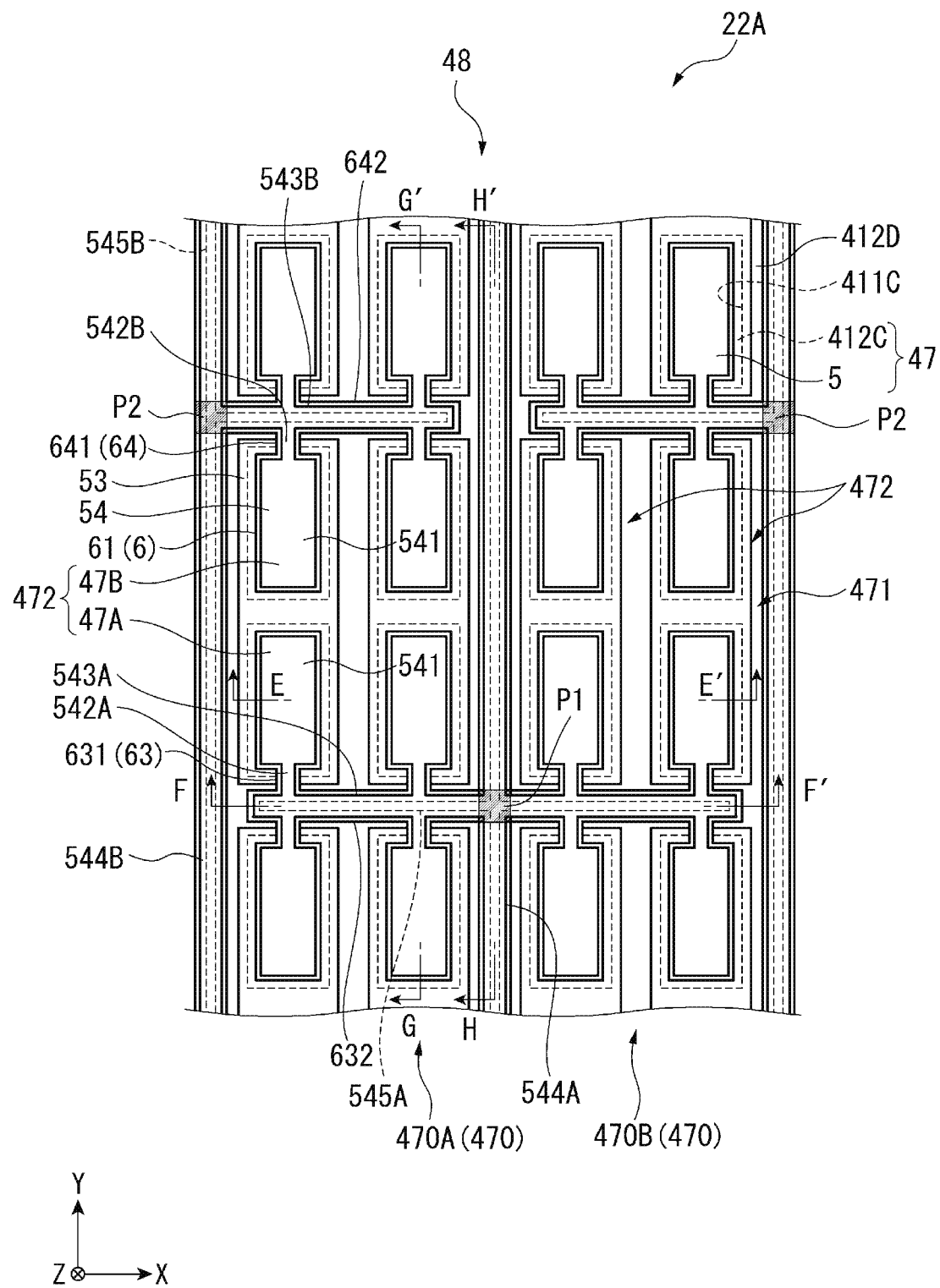
FIG. 9 is a plan view schematically illustrating an element substrate in an ultrasonic device of a second embodiment.
Figure 10:
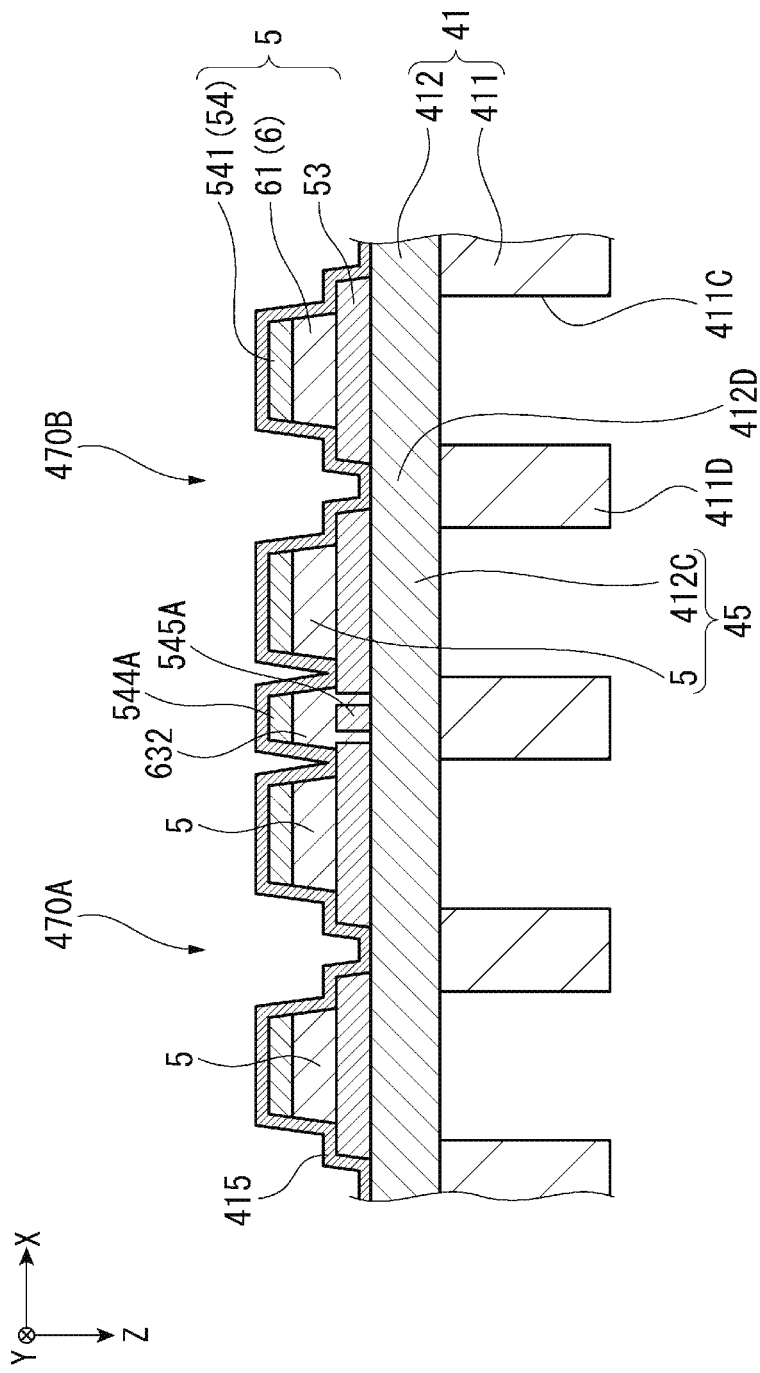
FIG. 10 is a sectional view schematically illustrating the ultrasonic device of the second embodiment.
Figure 11:
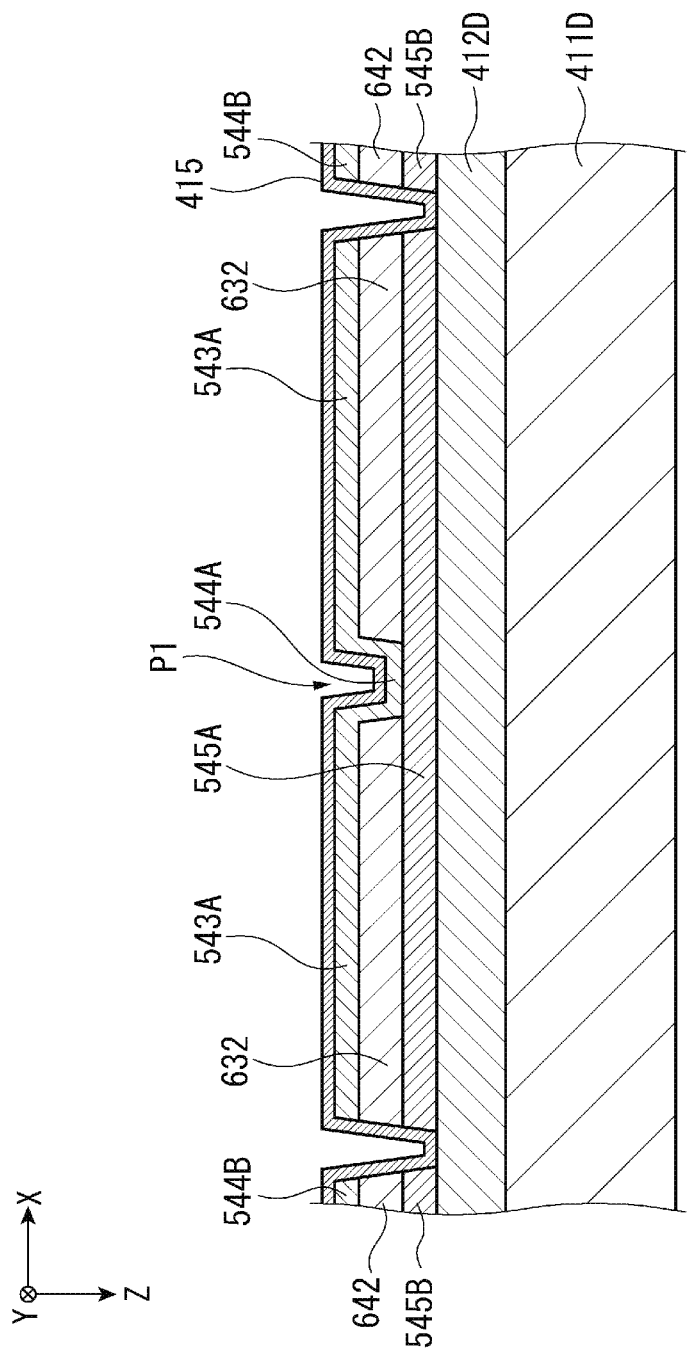
FIG. 11 is a sectional view schematically illustrating the ultrasonic device of the second embodiment.
Figure 12:
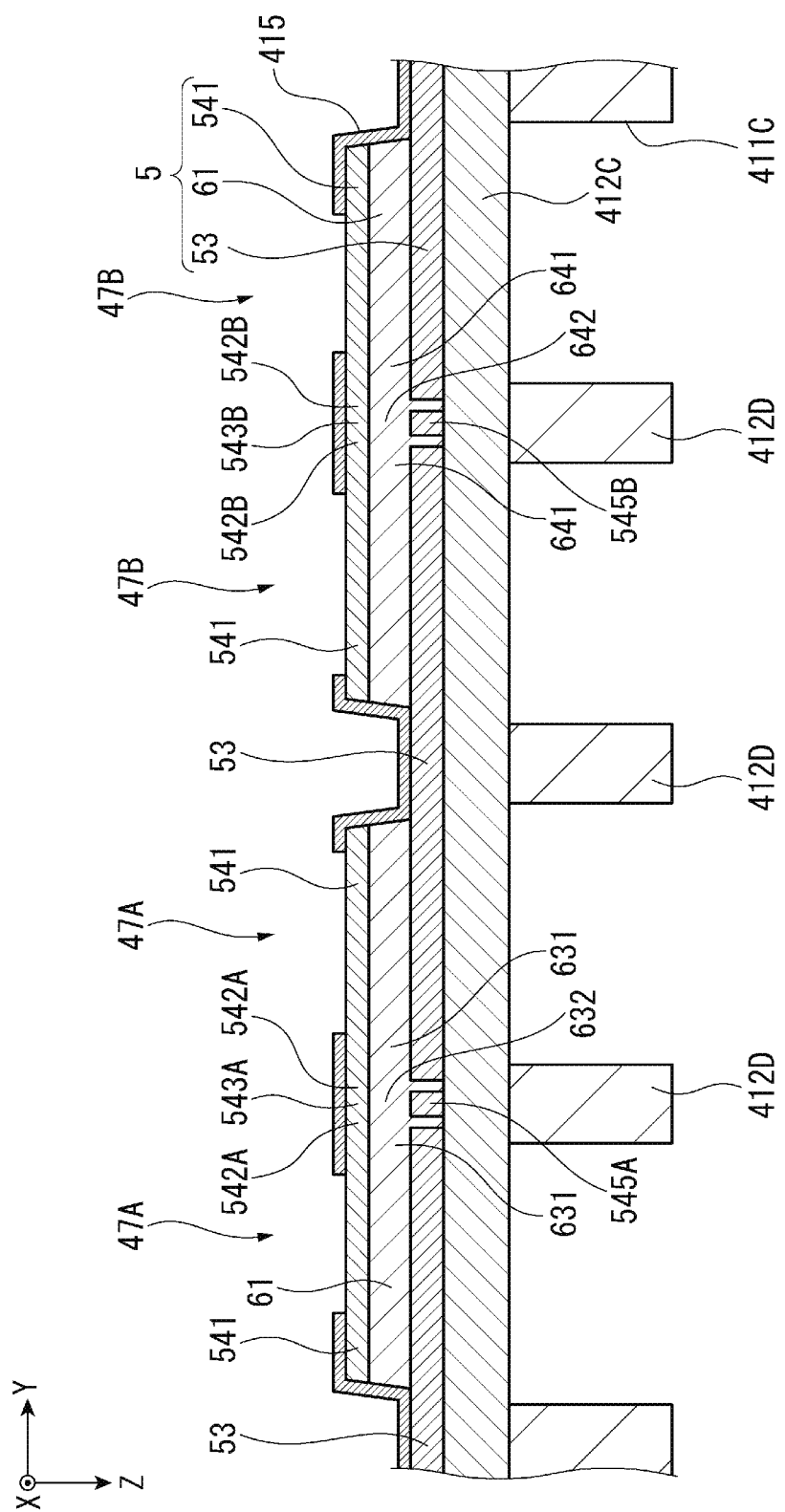
FIG. 12 is a sectional view schematically illustrating the ultrasonic device of the second embodiment.
Figure 13:
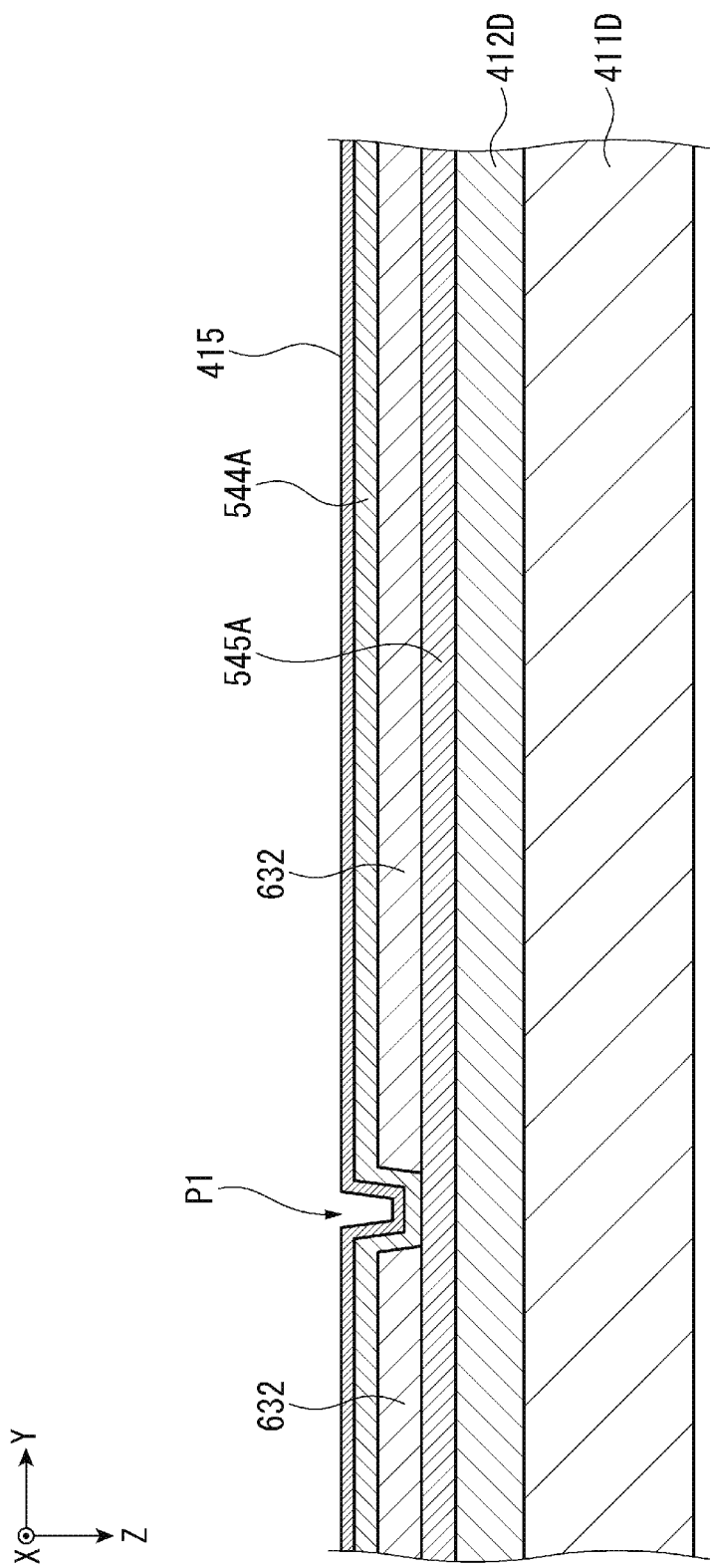
FIG. 13 is a sectional view schematically illustrating the ultrasonic device of the second embodiment.

FIG. 9 is a schematic diagram in which an element substrate 41 forming an ultrasonic device 22A is viewed from a sealing plate 42 side. FIG. 10 is a sectional view schematically illustrating a section of the ultrasonic device 22A taken along the line E-E' illustrated in FIG. 9. FIG. 11 is a sectional view schematically illustrating a section of the ultrasonic device 22A taken along the line F-F' illustrated in FIG. 9. FIG. 12 is a sectional view schematically illustrating a section of the ultrasonic device 22A taken along the line G-G' illustrated in FIG. 9. FIG. 13 is a sectional view schematically illustrating a section of the ultrasonic device 22A taken along the line H-H' illustrated in FIG. 9.

In the ultrasonic device 22A, in the same manner as in the first embodiment, an ultrasonic transducer array 48 is formed of a plurality of ultrasonic transducers 47 arranged in a matrix form. The ultrasonic transducer array 48 is formed as a one-dimensional ultrasonic array in which a plurality of ultrasonic transducer units 470 each functioning as a single transmission/reception channel are disposed along the X direction (scanning direction).

FIGS. 10 to 13 illustrate a part of the ultrasonic transducer array 48.

Configuration of Ultrasonic Transducer Unit

The ultrasonic transducer unit 470 is configured to include a plurality of ultrasonic transducers 47 disposed along the X direction and the Y direction as illustrated in FIG. 9. In the present embodiment, the ultrasonic transducer unit 470 is formed of two columns of ultrasonic transducers 47 adjacent to each other in the X direction among columns of the ultrasonic transducers 47 arranged along the Y direction. FIG. 9 illustrates two ultrasonic transducer units 470 adjacent to each other in the X direction.

The ultrasonic transducer unit 470 is configured so that a plurality of ultrasonic transducer groups 471 each including a plurality of ultrasonic transducers 47 are disposed in the Y direction. Each of the ultrasonic transducer groups 471 includes four ultrasonic transducers 47 disposed along the X direction and the Y direction.

Hereinafter, for convenience of description, the −X side of two ultrasonic transducer units 470 illustrated in FIG. 9 will also be referred to as a first unit 470A, and the +X side thereof will also be referred to as a second unit 470B.

Here, the first unit 470A and the second unit 470B are linearly symmetric to each other with respect to a virtual line which passes through an intermediate position between the first unit 470A and the second unit 470B in the X direction and is parallel to the Y direction.

Two ultrasonic transducer groups 471 adjacent to each other in the Y direction are linearly symmetric to each other with respect to a virtual line which passes through an intermediate position between the two ultrasonic transducer groups 471 and is parallel to the X direction.

Therefore, in the following description, the first unit 470A will be focused. The ultrasonic transducer group 471 illustrated at the center of FIG. 9 will be focused.

In the ultrasonic transducer group 471 forming the first unit 470A, two ultrasonic transducers 47 adjacent to each other along the Y direction are connected in series to each other so as to form a serial part 472. In the ultrasonic transducer group 471, two serial parts 472 adjacent to each other along the X direction are connected in parallel to each other. Serial parts 472 respectively included in a plurality of ultrasonic transducer groups 471 are also connected in parallel to each other.

In the following description, the −Y side of the two ultrasonic transducers 47 included in the serial part 472 will also be referred to as a first ultrasonic transducer 47A, and the +Y side thereof will also be referred to as a second ultrasonic transducer 47B.

The ultrasonic transducer 47 includes a vibration portion 412C and a piezoelectric element 5 provided on the vibration portion 412C, and the piezoelectric element 5 is formed as a laminate of a lower electrode 53, a piezoelectric film 6, and an upper electrode 54.

The lower electrode 53 is formed to cover two openings 411C respectively included in the first ultrasonic transducer 47A and the second ultrasonic transducer 47B. The lower electrode 53 is an electrode common to the first ultrasonic transducer 47A and the second ultrasonic transducer 47B. In other words, the lower electrode 53 is separately provided in each serial part 472. The lower electrode 51 is separated from other electrodes or wires.

The piezoelectric film 6 includes an active portion 61, a first extraction portion 63 connected to the active portion 61 of the first ultrasonic transducer 47A, and a second extraction portion 64 connected to the active portion 61 of the second ultrasonic transducer 47B.

The first extraction portion 63 includes a first extraction main part 631 and a first extension part 632.

The first extraction main part 631 is extracted from the active portion 61 of the first ultrasonic transducer 47A toward the −Y side, and is provided from the vibration portion 412C (opening 411C) to the support portion 412D (wall portion 411D) in a plan view. A width dimension of the first extraction main part 631 is smaller than a width dimension of the active portion 61.

The first extension part 632 is provided in a region overlapping the support portion 412D in a plan view.

Specifically, the first extension part 632 is provided on the support portion 412D (refer to FIG. 12) on the −Y side of the first ultrasonic transducer 47A and on the support portion 412D (refer to FIG. 10) between the first unit 470A and the second unit 470B.

The first extension part 632 is provided over the first unit 470A and the second unit 470B along the X direction on the −Y side of the first ultrasonic transducer 47A, and is connected to each first extraction main part 631 extracted from the first ultrasonic transducer 47A. Upper surfaces (surfaces on the −Z side) of the first extraction main part 631 and the first extension part 632 are coplanar with each other.

The first extension part 632 is provided over a plurality of ultrasonic transducer groups 471 along the Y direction between the first unit 470A and the second unit 470B.

The second extraction portion 64 includes a second extraction main part 641 and a second extension part 642.

The second extraction main part 641 is configured in the same manner as the first extraction main part 631 except that the second extraction main part 641 is extracted from the active portion 61 of the second ultrasonic transducer 47B toward the +Y side.

The second extension part 642 is provided on the support portion 412D (refer to FIG. 12) on the +Y side of the second ultrasonic transducer 47B and on the support portion 412D on the −X side of the first unit 470A. The second extension part 642 is provided over the first unit 470A and the second unit 470B along the X direction on the +Y side of the second ultrasonic transducer 47B, and is connected to each second extraction main part 641 extracted from the second ultrasonic transducer 47B. Upper surfaces (surfaces on the −Z side) of the second extraction main part 641 and the second extension part 642 are coplanar with each other. The second extension part 642 is provided over a plurality of ultrasonic transducer groups 471 along the Y direction on the −X side of the first unit 470A.

The upper electrode 54 is provided on the piezoelectric film 6, and includes an upper electrode main body portion 541, a first upper electrode extraction portion 542A, a second upper electrode extraction portion 542B, a first upper electrode connection portion 543A, a second upper electrode connection portion 543B, a first upper electrode extension portion 544A, and a second upper electrode extension portion 544B.

The upper electrode main body portion 541 is provided on the active portion 61 in the same manner as in the first embodiment. In other words, in a plan view, a region in which the lower electrode 53, the active portion 61, and the upper electrode main body portion 541 overlap each other is a drive region of the piezoelectric element 5 of the present embodiment.

The first upper electrode extraction portion 542A, the first upper electrode connection portion 543A, and the first upper electrode extension portion 544A are connected to the upper electrode main body portion 541 of the first ultrasonic transducer 47A.

The first upper electrode extraction portion 542A is provided on the first extraction main part 631, and is extracted from the upper electrode main body portion 541 of the first ultrasonic transducer 47A along the Y direction.

The first upper electrode connection portion 543A is provided over the first unit 470A and the second unit 470B along the X direction on the first extension part 632 on the −Y side of the first ultrasonic transducer 47A. The first upper electrode connection portion 543A connects a plurality of first upper electrode extraction portions 542A to each other on the first extension part 632.

The first upper electrode extension portion 544A is provided over a plurality of ultrasonic transducer groups 471 along the Y direction on the first extension part 632 located between the first unit 470A and the second unit 470B. Although not illustrated, the first upper electrode extension portion 544A connects a plurality of first upper electrode connection portions 543A to each other.

The second upper electrode extraction portion 542B, the second upper electrode connection portion 543B, and the second upper electrode extension portion 544B are connected to the upper electrode main body portion 541 of the second ultrasonic transducer 47B.

The second upper electrode extraction portion 542B is provided on the second extraction main part 641, and is extracted from the upper electrode main body portion 541 of the second ultrasonic transducer 47B along the Y direction.

The second upper electrode connection portion 543B is provided on the second extension part 642 on the +Y side of the second ultrasonic transducer 47B along the X direction.

The second upper electrode connection portion 543B connects a plurality of second upper electrode extraction portions 542B to each other on the first extension part 632.

The second upper electrode extension portion 544B is provided over a plurality of ultrasonic transducer groups 471 along the Y direction on the second extension part 642 located on the −X side of the first unit 470A. The second upper electrode extension portion 544B connects a plurality of second upper electrode connection portions 543B to each other.

Hereinafter, as illustrated in FIG. 9, a first upper electrode wiring portion 545A is provided at a position overlapping the first extension part 632, and a second upper electrode wiring portion 545B is provided at a position overlapping the second extension part 642, in a plan view on the element substrate 41. The first upper electrode wiring portion 545A and the second upper electrode wiring portion 545B are simultaneously formed with, for example, the lower electrode 53, and are separated from the lower electrode 53.

As illustrated in FIG. 9, the first upper electrode wiring portion 545A is connected to the first upper electrode extension portion 544A at an intersection position (first connection position P1) of intersecting the first extension part 632 along the X direction and the Y direction. In other words, as illustrated in FIGS. 11 and 13, at the first connection position P1, a part of the first extension part 632 is removed and the first upper electrode extension portion 544A is provided on the first upper electrode wiring portion 545A.

Although not illustrated, the first upper electrode wiring portion 545A is connected to the common terminal 413. Consequently, the upper electrode main body portion 521 of the first ultrasonic transducer 47A is set to a reference potential.

The second upper electrode wiring portion 545B is connected to the second upper electrode extension portion 544B at an intersection position (second connection position P2) of intersecting the second extension part 642 along the X direction and the Y direction. In other words, at the second connection position P2, a part of the second extension part 642 is removed, and the second upper electrode extension portion 544B is provided on the second upper electrode wiring portion 545B.

Although not illustrated, the second upper electrode wiring portion 545B is connected to the signal terminal 414. Consequently, the upper electrode main body portion 541 of the second ultrasonic transducer 47B is connected to the transmission circuit or the reception circuit of the circuit substrate 23.

In the ultrasonic device 22A configured in the above-described way, a drive voltage is applied to the upper electrode main body portion 541 of the second ultrasonic transducer 47B in the serial part 472 during transmission of an ultrasonic wave. Consequently, a potential difference is generated between the upper electrode main body portion 541 of the first ultrasonic transducer 47A and the upper electrode main body portion 541 of the second ultrasonic transducer 47B in the serial part 472, and thus each of the ultrasonic transducers 47A and 47B is driven.

During reception of an ultrasonic wave, a potential difference generated between the upper electrode main body portions 541 of the first ultrasonic transducer 47A and the second ultrasonic transducer 47B is output from the serial part 472 as a detection signal.

Advantageous Effects of Second Embodiment

The ultrasonic device 22A includes a plurality of ultrasonic transducer units 470, and each ultrasonic transducer unit 470 has a configuration in which a plurality of serial parts 472 each including a plurality of ultrasonic transducers 47 connected in series to each other are connected in parallel to each other. In this configuration, when an ultrasonic wave is received, a signal corresponding to a sum of potential differences generated in the respective piezoelectric elements 5 connected in series to each other is output from the serial part 472. Therefore, it is possible to improve the reception sensitivity of the ultrasonic device 22A.

Third Embodiment

Hereinafter, a third embodiment will be described.

In the ultrasonic device of the first embodiment and the second embodiment, the extraction portion of which a width dimension is smaller than that of the active portion and which has a substantially rectangular shape in a plan view is extracted from the active portion of the piezoelectric film. In contrast, the third embodiment is different from the first and second embodiments in that the extraction portion has a connection part of which a width dimension increases toward the active portion.

In the following description, the same constituent elements as those in the first embodiment are given the same reference numerals, and description thereof will be omitted or will be made briefly.

Figure 14:
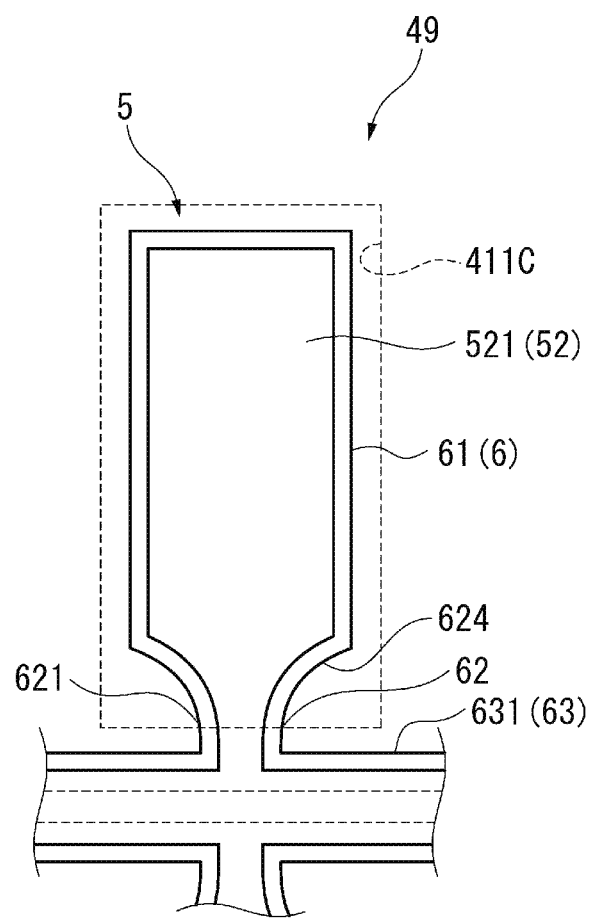
FIG. 14 is a plan view schematically illustrating an ultrasonic transducer of a third embodiment.

FIG. 14 is a plan view schematically illustrating an ultrasonic transducer 49 of the third embodiment.

In the ultrasonic transducer 49, the extraction portion 62 includes a connection part 624 connected to the active portion 61.

The connection part 624 has an increasing width dimension toward the active portion 61 in a plan view. In FIG. 14, the connection part 624 is provided at a part of the extraction main part 621 extending from the active portion 61. A width dimension of the connection part 624 at a boundary position with the active portion 61 is substantially the same as a width dimension of the active portion 61. An edge of the connection part 624 is curved inward of the connection part 624 so as to be depressed in a plan view.

Advantageous Effects of Third Embodiment

The extraction portion 62 includes the connection part 624 having an increasing width dimension toward the active portion 61. Consequently, it is possible to reduce an area of the extraction portion 62 in a plan view, to suppress deterioration in the transmission/reception sensitivity, and also to suppress deterioration in the rigidity of the extraction portion 62. It is possible to suppress the stress from concentrating on the connection part 624 and thus to prevent the occurrence of a crack due to the stress.

In a plan view, the edge of the connection part 624 is curved. Consequently, it is possible to more reliably suppress the stress from concentrating on the connection part 624.

MODIFICATION EXAMPLES

The invention is not limited to the above-described embodiments, and includes configurations obtained through modifications and alterations within the scope in which the object of the invention can be achieved, and combinations of the respective embodiments.

Modification Example 1

The second embodiment has exemplified the ultrasonic transducer unit having a configuration in which a plurality of serial parts each formed of two ultrasonic transducers connected in series to each other are connected in parallel to each other. However, the configuration is only an example, and configurations illustrated in FIGS. 15 to 18 may be exemplified as a configuration of an ultrasonic transducer unit including ultrasonic transducers connected in series to each other.

Figure 15:
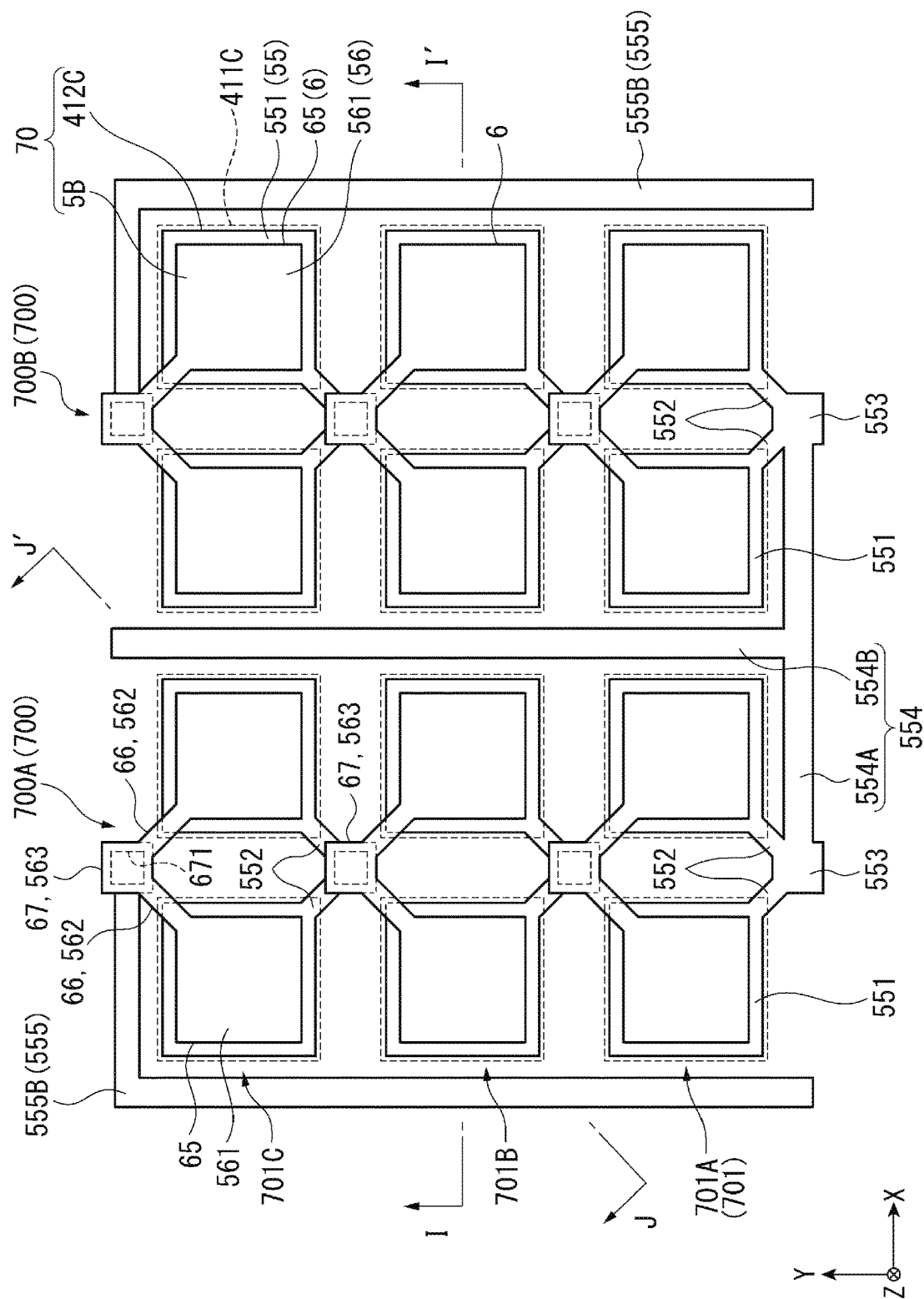
FIG. 15 is a plan view schematically illustrating an element substrate in an ultrasonic device related to a modification example.
Figure 16:
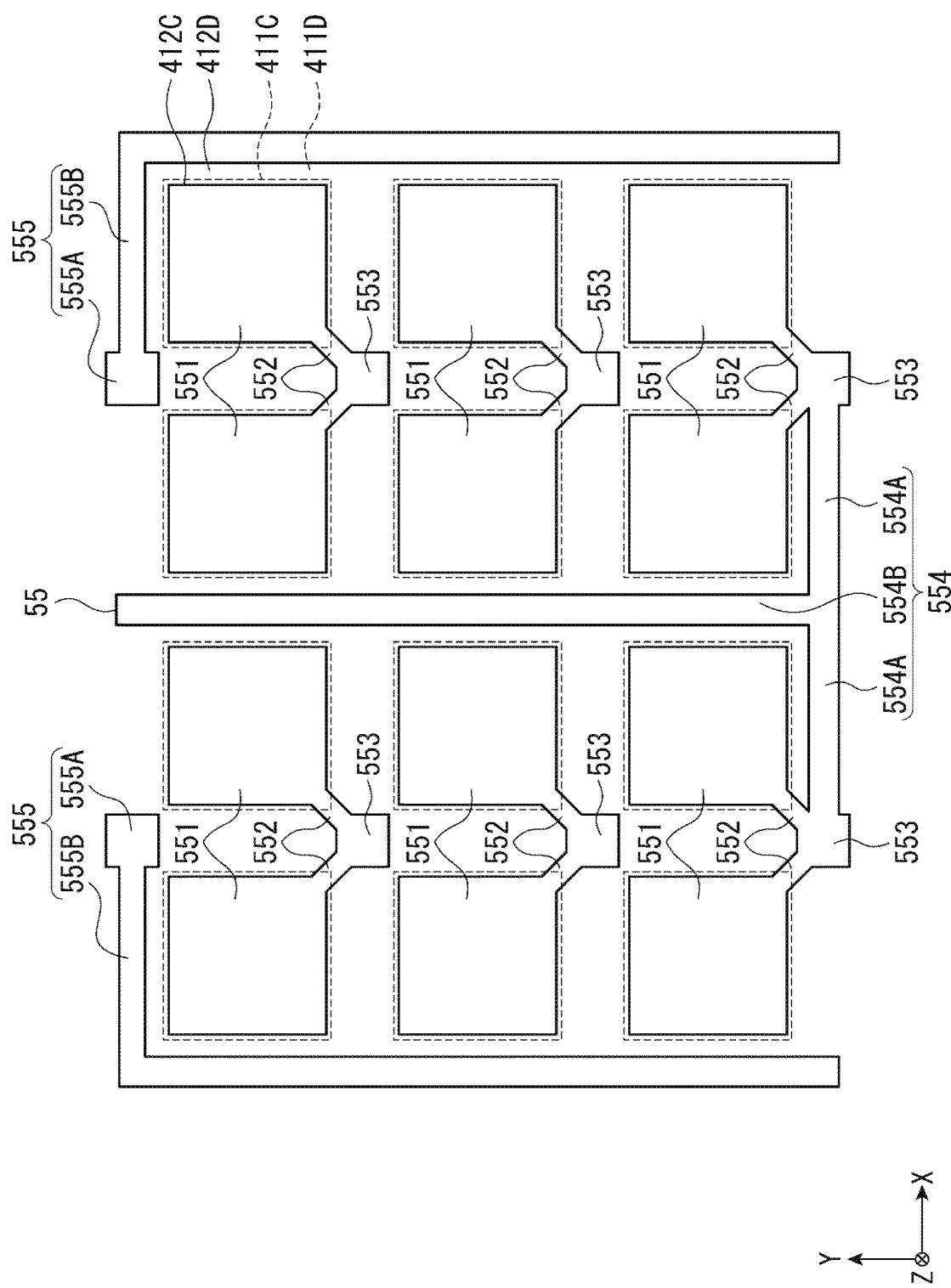
FIG. 16 is a plan view schematically illustrating a lower electrode in an ultrasonic device related to the modification example.
Figure 17:
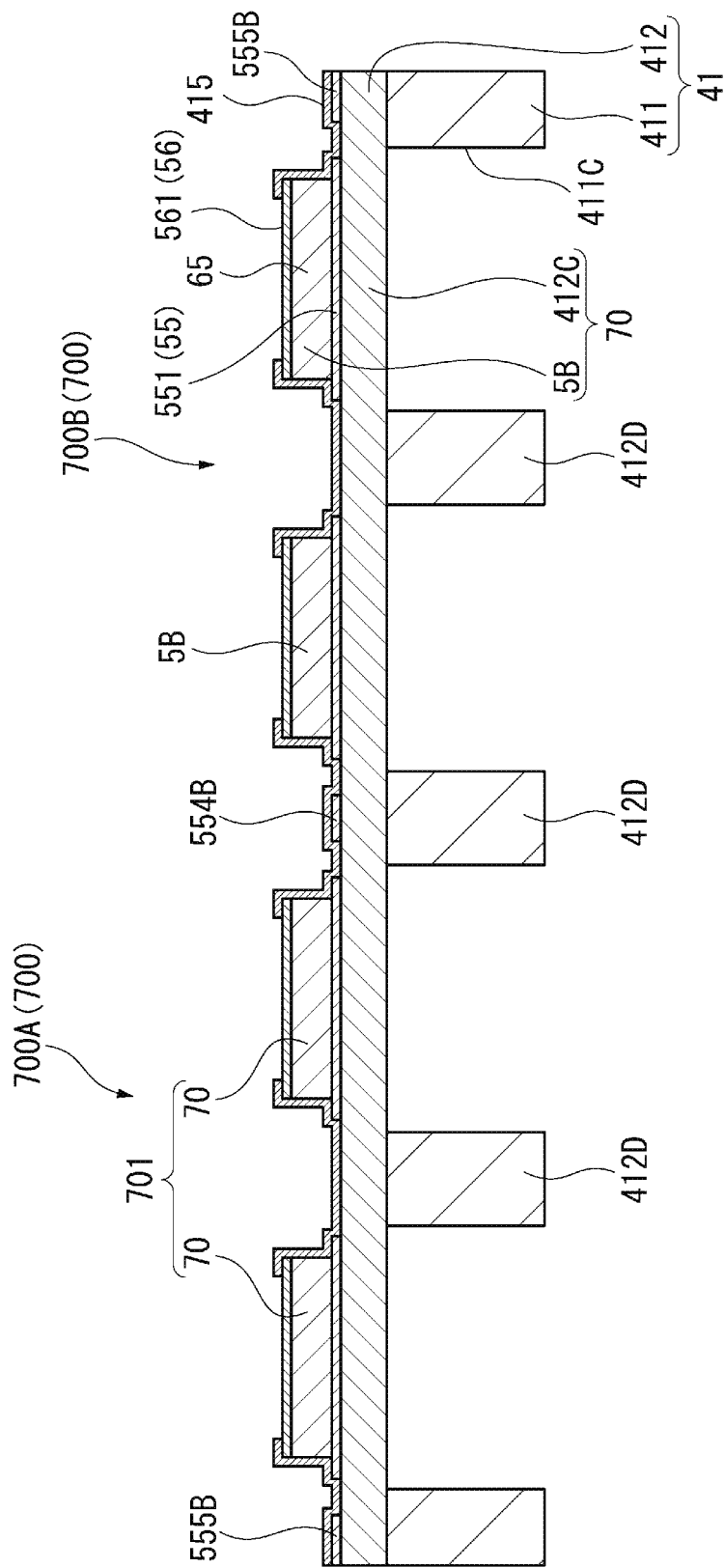
FIG. 17 is a sectional view schematically illustrating an ultrasonic device related to the modification example.
Figure 18:
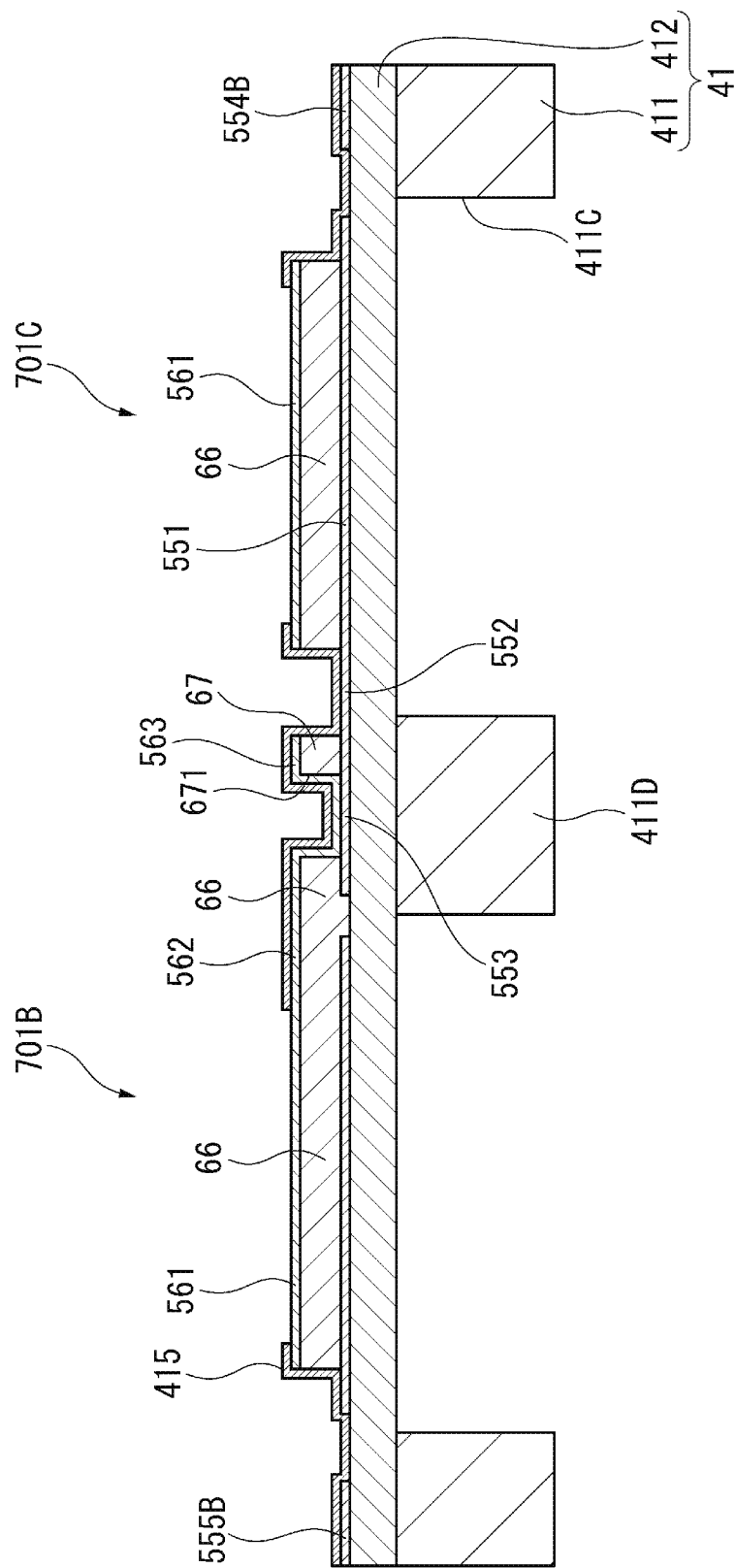
FIG. 18 is a sectional view schematically illustrating an ultrasonic device related to the modification example.

FIG. 15 is a plan view illustrating a schematic configuration of an ultrasonic transducer unit included in an ultrasonic device related to Modification Example 1. FIG. 16 is a plan view illustrating a lower electrode and an upper electrode wiring portion in the ultrasonic transducer unit illustrated in FIG. 15. FIG. 17 is a sectional view schematically illustrating a section of the ultrasonic device taken along the line I-I' illustrated in FIG. 15. FIG. 18 is a sectional view schematically illustrating a section of the ultrasonic device taken along the line J-J' illustrated in FIG. 15. In FIGS. 15 to 18, the acoustic layer 43 and the acoustic lens 44 are not illustrated.

As illustrated in FIG. 15, an ultrasonic transducer unit 700 has a configuration in which a plurality of ultrasonic transducers 70 are disposed in a matrix form along the X direction and the Y direction.

In the ultrasonic transducer unit 700, a plurality of parallel portions 701 each including a plurality of ultrasonic transducers 70 connected in parallel to each other are connected in series to each other. In the present modification example, in the parallel portion 701, two ultrasonic transducers 70 disposed along the X direction are connected in parallel to each other. The ultrasonic transducer unit 700 has a configuration in which the parallel portions 701 of an odd number (three in the present modification example) are disposed along the Y direction.

Hereinafter, the respective parallel portions 701 will also be referred to as a first parallel portion 701A, a second parallel portion 701B, and a third parallel portion 701C.

FIG. 15 illustrates two ultrasonic transducer units 700 disposed in the X direction as a part of an ultrasonic transducer array including a plurality of ultrasonic transducer units 700. The −X side of the two ultrasonic transducer units 700 will also be referred to as a first unit 700A, and the +X side thereof will also be referred to as a second unit 700B.

The first unit 700A and the second unit 700B are linearly symmetric to each other with respect to a virtual line which passes through an intermediate position between the first unit 700A and the second unit 700B in the X direction and is parallel to the Y direction. Therefore, hereinafter, the first unit 700A will be focused.

The ultrasonic transducer 70 includes a vibration portion 412C and a piezoelectric element 5B provided on the vibration portion 412C, and the piezoelectric element 5B is formed as a laminate of a lower electrode 55, a piezoelectric film 6, and an upper electrode 56.

The lower electrode 55 includes, as illustrated in FIG. 16, a lower electrode main body portion 551, a lower electrode extraction portion 552, a lower electrode connection portion 553, and a lower electrode wiring portion 554.

The lower electrode main body portion 551 is separately provided in each ultrasonic transducer 70 at a position overlapping the vibration portion 412C (opening 411C) in a plan view. An outer edge of the lower electrode main body portion 551 is located inside an outer edge of the vibration portion 412C in a plan view. The lower electrode main body portion 551 may be provided to cover the vibration portion 412C so that the outer edge of the lower electrode main body portion 551 is located outside the outer edge of the vibration portion 412C.

The lower electrode extraction portion 552 is extracted from the lower electrode main body portion 551, and is provided from the vibration portion 412C to the support portion 412D in a plan view.

The lower electrode connection portion 553 is provided on the support portion 412D in a plan view, and connects the lower electrode extraction portions 552 of the ultrasonic transducers 70 forming the parallel portion 701 to each other.

In the present modification example, as illustrated in FIG. 15, a single lower electrode connection portion 553 is provided with respect to two ultrasonic transducers 70 adjacent to each other in the X direction at a position on the −Y side of each parallel portion 701. For example, in a case where the parallel portion 701 is formed of n ultrasonic transducers 70 disposed along the X direction, (n−1) lower electrode connection portions 553 may be provided. Consequently, the lower electrode main body portions 551 of two ultrasonic transducers 70 adjacent to each other in the X direction are connected to each other.

The lower electrode wiring portion 554 is provided on the support portion 412D in a plan view, and is connected to the lower electrode connection portion 553 of the first parallel portion 701A. In the present modification example, the lower electrode wiring portion 554 includes a first wiring part 554A and a second wiring part 554B.

The first wiring part 554A is provided along the X direction, and is connected to the lower electrode connection portions 553 of each first parallel portion 701A in the first unit 700A and the second unit 700B.

The second wiring part 554B is provided along the Y direction at an intermediate position between the first unit 700A and the second unit 700B in the X direction, and is connected to the first wiring part 554A. Although not illustrated, the second wiring part 554B is connected to, for example, a reference circuit of the circuit substrate 23. Consequently, each lower electrode main body portion 551 of the first parallel portion 701A is set to a reference potential.

An upper electrode wiring portion 555 is formed on the support portion 412D. The upper electrode wiring portion 555 includes a conduction part 555A and an extraction wiring part 555B. The conduction part 555A is provided on the +Y side of a third unit, and is connected to an upper electrode connection portion 563 of the third unit which will be described later. The extraction wiring part 555B is extracted from the conduction part 555A, and is connected to, for example, the transmission circuit or the reception circuit of the circuit substrate 23 although not illustrated.

The piezoelectric film 6 includes an active portion 65, a piezoelectric body extraction portion 66, and a piezoelectric body connection portion 67.

The active portion 65 is provided on the lower electrode main body portion 551. In a plan view, an outer dimension of the active portion 65 is smaller than a dimension of each of the vibration portion 412C (opening 411C) and the lower electrode main body portion 551.

The piezoelectric body extraction portion 66 is extracted from the active portion 65 toward the +Y side, and is provided from the vibration portion 412C to the support portion 412D in a plan view. A width dimension of the piezoelectric body extraction portion 66 is smaller than a width dimension (maximum dimension) of the active portion 65. The piezoelectric body extraction portion 66 of the first parallel portion 701A is extracted toward the lower electrode connection portion 553 of the second parallel portion 701B. The piezoelectric body extraction portion 66 of the second parallel portion 701B is extracted toward the lower electrode connection portion 553 of the third parallel portion 701C. The piezoelectric body extraction portion 66 of the third parallel portion 701C is extracted toward the conduction part 555A of the upper electrode wiring portion 555.

The piezoelectric body connection portion 67 is provided on the lower electrode connection portion 553 and the conduction part 555A. In other words, the piezoelectric body connection portion 67 of the first parallel portion 701A is provided on the lower electrode connection portion 553 of the second parallel portion 701B, and is connected to the piezoelectric body extraction portion 66. Similarly, the piezoelectric body connection portion 67 of the second parallel portion 701B is provided on the lower electrode connection portion 553 of the third parallel portion 701C. The piezoelectric body connection portion 67 of the third parallel portion 701C is provided on the conduction part 555A of the upper electrode wiring portion 555.

The upper electrode 56 is provided on the piezoelectric film 6, and includes an upper electrode main body portion 561, an upper electrode extraction portion 562, and an upper electrode connection portion 563.

The upper electrode main body portion 561 is provided on the active portion 65. In other words, in a plan view, a region in which the lower electrode main body portion 551, the active portion 65, and the upper electrode main body portion 561 overlap each other is a drive region of the piezoelectric element 5B of the present embodiment.

The upper electrode extraction portion 562 is provided on the piezoelectric body extraction portion 66. In a plan view, the upper electrode extraction portion 562 is extracted from the upper electrode main body portion 561, and is provided from the vibration portion 412C to the support portion 412D.

The upper electrode connection portion 563 is provided on the piezoelectric body connection portion 67, and is connected to the upper electrode extraction portion 562.

As illustrated in FIGS. 15 and 18, in a plan view, the upper electrode connection portion 563 and the lower electrode connection portion 553 overlapping each other, and the upper electrode connection portion 563 and the conduction part 555A are connected to each other in through-holes 671 formed in the piezoelectric body connection portion 67. In other words, the upper electrode connection portion 563 of the first parallel portion 701A is connected to the lower electrode connection portion 553 of the second parallel portion 701B. The upper electrode connection portion 563 of the second parallel portion 701B is connected to the lower electrode connection portion 553 of the third parallel portion 701C. The upper electrode connection portion 563 of the third parallel portion 701C is connected to the conduction part 555A of the upper electrode wiring portion 555.

In the ultrasonic transducer unit 700 configured as described above, the first parallel portion 701A, the second parallel portion 701B, and the third parallel portion 701C are connected in series to each other in this order.

The first unit 700A and the second unit 700B configured as described above are disposed in a plurality in the X direction, and thus an ultrasonic transducer array as an one-dimensional ultrasonic array can be configured.

If the first unit 700A and the second unit 700B are disposed in the X direction and the Y direction, and each ultrasonic transducer unit 700 can be separately driven, an ultrasonic transducer array as a two-dimensional ultrasonic array can be configured.

In Modification Example 1, an exemplary configuration in which three parallel portions 701 are provided has been described, but this is only an example, and there may be a configuration in which two or four or more parallel portions 701 are provided.

In the parallel portion 701, two ultrasonic transducers 70 are connected in parallel to each other, but, this is only an example, and three or more ultrasonic transducers 70 may be connected in parallel to each other.

Other Modification Examples

In the first and second embodiments, the lower electrode is provided to cover the vibration portion 412C, but, this is only an example, and, as in Modification Example 1, an outer edge of the lower electrode (lower electrode main body portion) may be located inside an outer edge of the vibration portion 412C in a plan view. The lower electrode may be provided such that at least a part of the outer edge of the lower electrode (lower electrode main body portion) straddles a part of the outer edge of the vibration portion 412C.

In the respective embodiments and modification example, a description has been made of an exemplary configuration in which the upper surfaces of the active portion and the extraction portion are coplanar with each other, but this is only an example. For example, a step difference may be formed at a part of the active portion or the extraction portion. A step difference may be formed at a boundary between the active portion and the extraction portion.

In the first and second embodiments, a description has been made of an exemplary configuration in which the upper electrode is connected to the common terminal 413 or the signal terminal 414 in the terminal region Ar2 via the upper electrode wiring portion (the first upper electrode wiring portion and the second upper electrode wiring portion), but this is only an example. For example, a bump electrode which protrudes toward, for example, the connection position P, P1, or P2 of the element substrate 41 may be provided on the sealing plate 42, and the circuit substrate 23 and the ultrasonic transducer may be connected to each other via the bump electrode and a wiring provided on the sealing plate 42. In this configuration, compared with a case where each ultrasonic transducer is connected to the common terminal 413 or the signal terminal 414 of the terminal region Ar2 via the upper electrode wiring portion, a difference in a wiring length to each ultrasonic transducer can be reduced, and thus it is possible to suppress the influence of a voltage drop. Also in this case, as in the above-described embodiments, the upper electrode wiring portion is provided, and thus the common terminal 413 or the signal terminal 414 can be used, for example, when an operation test is performed during manufacturing.

In the first and second embodiments, a description has been made of an exemplary configuration in which the upper electrode wiring portion (third electrode) is provided on the support portion 412D, and the extraction portion and the upper electrode are provided in the substantially entire region at the position overlapping the upper electrode wiring portion, but this is only an example. For example, in the first embodiment, there may be a configuration in which the upper electrode wiring portion is provided at a position overlapping the second extension part 623 including the connection position P, and is not provided at a position overlapping the first extension part 622. There may be a configuration in which the upper electrode wiring portion is not provided, and the upper electrode is extracted to the terminal region. In a case where the upper electrode wiring portion is not provided, the ultrasonic transducer may be connected to the circuit substrate 23 via a bump electrode and a wiring provided on the sealing plate 42 as described above.

In the first embodiment, a description has been made of an exemplary case where the −X side columns L1 and the +X side columns L2 are connected in parallel to each other in the circuit substrate 23, and the ultrasonic transducer unit 450 is configured as a single transmission/reception channel, but this is only an example. For example, different drive signals may be input to the signal terminals 414 of the −X side columns L1 and the +X side columns L2, and thus each of the −X side columns L1 and the +X side columns L2 may be used as a single transmission/reception channel. There may be a configuration in which simultaneous driving and separate driving of the −X side columns L1 and the +X side columns L2 can be switched in the circuit substrate 23.

In the first and second embodiments, the one-dimensional ultrasonic array in which the ultrasonic transducer units are arranged in one direction has been exemplified, but this is only an example. For example, a two-dimensional ultrasonic array may be configured by disposing ultrasonic transducer units in a matrix form. In this case, at least a signal terminal may be separately provided in each ultrasonic transducer unit.

In the third embodiment, the edge of the connection part 624 of the extraction main part 621 is curved to be depressed inward in a plan view, but is not limited thereto. For example, the edge of the connection part 624 may be linear, and may be curved to be projected outward.

The connection part 624 is provided at a part of the active portion 61 side of the extraction main part 621. In other words, a part of the extraction main part 621 has an increasing width dimension toward the active portion 61, but the extraction main part 621 may have an increasing width dimension toward the active portion 61 in the entire region in the extension direction thereof.

A description has been made of an exemplary configuration in which a width dimension of the connection part 624 is substantially the same as a width dimension of the active portion 61 at a boundary position with the active portion 61, but the width dimension of the connection part 624 may be smaller than the width dimension of the active portion 61.

In the respective embodiments, the lower electrode and the upper electrode are made of a metal material, but are not limited thereto. For example, the lower electrode and the upper electrode may be formed by using a tin oxide-based conductive material such as indium tin oxide (ITO) or fluorine-doped tin oxide (FTC)), a zinc oxide-based conductive material, an oxide conductive material such as strontium ruthenate ($SrRuO_3$), lanthanum nickelate ($LaNiO_3$), or elemental doped strontium titanate, or a conductive polymer.

In the respective embodiments, a description has been made of an exemplary configuration in which the piezoelectric element and the sealing plate 42 are provided on the support film 412 on an opposite side to the substrate main body portion 411 (opening 411C), the acoustic layer 43 and the acoustic lens 44 are provided on the substrate main body portion 411, and an ultrasonic wave is transmitted and received from the surface on the substrate main body portion 411 side, but this is only an example. For example, there may be a configuration in which the piezoelectric element 5, the acoustic layer 43, and the acoustic lens 44 are provided on the support film 412 on an opposite side to the substrate main body portion 411, the sealing plate 42 (reinforcement plate) is provided on the substrate main body portion 411 side, and an ultrasonic wave is transmitted and received from a surface opposite side to the substrate main body portion 411.

In the embodiments, a description has been made of an exemplary configuration in which the ultrasonic apparatus employs an organ in a living body as a measurement target, but the invention is not limited thereto. For example, the configurations of the embodiments and each modification example are applicable to a measurement apparatus which employs various structural bodies as measurement targets, and detects defects of the structural bodies or examines deterioration thereof. For example, the configurations of the embodiments and each modification example are applicable to a measurement apparatus which employs various semiconductor packages, wafers, or the like as measurement targets, and detects defects of the measurement targets.

A specific structure at the time of implementing the invention may be configured by combining the respective embodiments and modification examples with each other as appropriate within the scope of being capable of achieving the object of the invention, and may be altered to other structures as appropriate.

The entire disclosure of Japanese Patent Application No. 2016-250712 filed Dec. 26, 2016 is expressly incorporated by reference herein.

What is claimed is:

1. An ultrasonic device comprising:
a first ultrasonic transducer, the first ultrasonic transducer being configured with:
a vibration film;
a first electrode disposed on the vibration film in a first direction;
a first piezoelectric body disposed on the first electrode in the first direction; and
a second electrode disposed on the first piezoelectric body in the first direction; and
a second ultrasonic transducer, the second ultrasonic transducer being configured with:
the vibration film;
the first electrode disposed on the vibration film;
a second piezoelectric body disposed on the first electrode in the first direction; and
a third electrode disposed on the second piezoelectric body in the first direction,
wherein an outer circumferential edge of the first electrode is larger than an outer circumferential edge of each of the first and second piezoelectric bodies when viewed along the first direction,
the first piezoelectric body includes:
a first active member; and
a first extraction member that is connected to an end of the first active member, and a width dimension of the first extraction member is smaller than a width dimension of the first active member when viewed along the first direction,
the second piezoelectric body includes:
a second active member; and
a second extraction member that is connected to an end of the second active member, and a width dimension of the second extraction member is smaller than a width dimension of the second active member when viewed along the first direction,
an end of the first extraction member is connected to an end of the second extraction member, and
the second electrode extends on the first extraction member, and the third electrode extends on the second extraction member so as to be connected to the second electrode.

2. The ultrasonic device according to claim 1,
wherein the first piezoelectric body further includes a first connection member that is connected between the end of the first active member and the other end of the first extraction member, and a width dimension of the first connection member increases from the first extraction member toward the first active member, and
the second piezoelectric body further includes a second connection member that is connected between the end of the second active member and the other end of the second extraction member, and a width dimension of the second connection member increases from the second extraction member toward the second active member.

3. The ultrasonic device according to claim 1,
wherein the first electrode covers the vibration film in the first direction.

4. The ultrasonic device according to claim 1,
wherein surfaces of the first and second piezoelectric bodies on an opposite side to the first electrode are coplanar with each other.

5. The ultrasonic device according to claim 1, further comprising:
a substrate having a plurality of openings; and
a support film closing the plurality of openings of the substrate,
wherein part of the support film is the vibration film, and the vibration film is located at areas corresponding to the plurality of openings of the substrate, and
the end of the first extraction member is connected to the end of the second extraction member at a first region of the support film, the first region is laterally shifted from the areas corresponding to the plurality of openings of the substrate.

6. The ultrasonic device according to claim 5,
wherein the first electrode is disposed on a second region of the support film, and the second region is laterally shifted from the first region.

7. The ultrasonic device according to claim 6, further comprising:
a fourth electrode that is provided at the first region of the support film, the fourth electrode being separated from the first electrode,
wherein the first and second extraction members are formed on the fourth electrode.

8. An ultrasonic apparatus comprising:
an ultrasonic device, the ultrasonic device having:
a first ultrasonic transducer, the first ultrasonic transducer being configured with:
a vibration film;
a first electrode disposed on the vibration film in a first direction;
a first piezoelectric body disposed on the first electrode in the first direction; and
a second electrode disposed on the first piezoelectric body in the first direction; and
a second ultrasonic transducer, the second ultrasonic transducer being configured with:
the vibration film;
the first electrode disposed on the vibration film;

a second piezoelectric body disposed on the first electrode in the first direction; and a third electrode disposed on the second piezoelectric body in the first direction; and a controller that controls the ultrasonic device, wherein an outer circumferential edge of the first electrode is larger than an outer circumferential edge of each of the first and second piezoelectric bodies when viewed along the first direction, the first piezoelectric body includes:

a first active member; and a first extraction member that is connected to an end of the first active member, and a width dimension of the first extraction member is smaller than a width dimension of the first active member when viewed along the first direction, the second piezoelectric body includes:

a second active member; and a second extraction member that is connected to an end of the second active member, and a width dimension of the second extraction member is smaller than a width dimension of the second active member when viewed along the first direction, an end of the first extraction member is connected to an end of the second extraction member, and the second electrode extends on the first extraction member, and the third electrode extends on the second extraction member so as to be connected to the second electrode.

9. The ultrasonic apparatus according to claim 8, wherein the first piezoelectric body further includes a first connection member that is connected between the end of the first active member and the other end of the first extraction member, and a width dimension of the first connection member increases from the first extraction member toward the first active member, and the second piezoelectric body further includes a second connection member that is connected between the end of the second active member and the other end of the second extraction member, and a width dimension of the second connection member increases from the second extraction member toward the second active member.

10. The ultrasonic apparatus according to claim 8, wherein the first electrode covers the vibration film in the first direction.

11. The ultrasonic apparatus according to claim 8, wherein surfaces of the first and second piezoelectric bodies on an opposite side to the first electrode are coplanar with each other.

12. The ultrasonic apparatus according to claim 8, further comprising:

a substrate having a plurality of openings; and a support film closing the plurality of openings of the substrate, wherein part of the support film is the vibration film, and the vibration film is located at areas corresponding to the plurality of openings of the substrate, and the end of the first extraction member is connected to the end of the second extraction member at a first region of the support film, the first region is laterally shifted from the areas corresponding to the plurality of openings of the substrate.

13. The ultrasonic apparatus according to claim 12, wherein the first electrode is disposed on a second region of the support film, and the second region is laterally shifted from the first region.

14. The ultrasonic apparatus according to claim 13, further comprising:

a fourth electrode that is provided at the first region of the support film, the fourth electrode being separated from the first electrode, wherein the first and second extraction members are formed on the fourth electrode.

* * * * *